(12) United States Patent
Matsushima

(10) Patent No.: US 8,604,494 B2
(45) Date of Patent: *Dec. 10, 2013

(54) ORGANIC LIGHT-EMITTING PANEL FOR CONTROLLING AN ORGANIC LIGHT EMITTING LAYER THICKNESS, AND ORGANIC DISPLAY DEVICE

(75) Inventor: Hideaki Matsushima, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/313,206

(22) Filed: Dec. 7, 2011

(65) Prior Publication Data

US 2012/0091441 A1    Apr. 19, 2012

Related U.S. Application Data

(63) Continuation of application No. PCT/JP2010/006145, filed on Oct. 15, 2010.

(51) Int. Cl.
| H01L 29/18 | (2006.01) |
| H01L 29/20 | (2006.01) |
| H01L 33/00 | (2010.01) |
| H01L 29/08 | (2006.01) |
| H01L 21/00 | (2006.01) |

(52) U.S. Cl.
USPC .......... 257/89; 257/88; 257/40; 257/E51.018; 257/E51.022; 438/34; 438/35

(58) Field of Classification Search
USPC .............. 257/40, 88, 89, E27.119, E51.018, 257/E51.022; 438/28, 34, 35; 313/504
See application file for complete search history.

(56) References Cited

U.S. PATENT DOCUMENTS

| 5,443,922 A | 8/1995 | Nishizaki et al. |
| 6,388,377 B1 | 5/2002 | Kobayashi et al. |

(Continued)

FOREIGN PATENT DOCUMENTS

| JP | 05-163488 | 6/1993 |
| JP | 2002-222695 | 8/2002 |

(Continued)

OTHER PUBLICATIONS

International Search Report in PCT/JP2010/006145, which was mailed on Jan. 18, 2011.

(Continued)

*Primary Examiner* — Fernando L Toledo
*Assistant Examiner* — Aaron Gray
(74) *Attorney, Agent, or Firm* — Greenblum & Bernstein, P.L.C.

(57) ABSTRACT

A non-light-emitting cell 100c is provided between pixels 100a and 100b. In formation of the pixel 100a, ink for forming an organic light-emitting layer is dripped into sub-pixels 100a1, 100a2, 100a3 in this order. This also applies to the pixel 100b. However, such ink is not dripped into the non-light-emitting cell 100c since the organic light-emitting layer is not formed in the non-light-emitting cell 100c. Regarding banks 105c and 105d defining the sub-pixel 100a3 of the pixel 100a, an inclination angle θ$d3$ of a wall 105d3 of the bank 105d is larger than an inclination angle θ$c3$ of a wall 105c3 of the bank 105c. Meanwhile, regarding banks 105e and 105f defining the sub-pixel 100b1, an inclination angle θ$e1$ of a wall 105e1 of the bank 105e is equivalent to an inclination angle θ$f1$ of a wall 105f1 of the bank 105f.

17 Claims, 22 Drawing Sheets

(56) References Cited

U.S. PATENT DOCUMENTS

| | | |
|---|---|---|
| 6,559,604 B2 | 5/2003 | Lu et al. |
| 6,762,552 B1 | 7/2004 | Duineveld et al. |
| 7,034,453 B2 | 4/2006 | Kai et al. |
| 7,038,651 B2 | 5/2006 | Nitta et al. |
| 7,332,854 B2 | 2/2008 | Kai et al. |
| 7,352,350 B2 | 4/2008 | Nitta et al. |
| 7,642,701 B2 | 1/2010 | Kai et al. |
| 7,994,711 B2 | 8/2011 | Nakamura et al. |
| 8,129,902 B2 | 3/2012 | Kai et al. |
| 8,193,699 B2 | 6/2012 | Fujioka et al. |
| 2002/0064966 A1 | 5/2002 | Seki et al. |
| 2002/0079833 A1 | 6/2002 | Kobayashi et al. |
| 2002/0158835 A1* | 10/2002 | Kobayashi et al. ........... 345/100 |
| 2003/0179221 A1 | 9/2003 | Nitta et al. |
| 2004/0021413 A1* | 2/2004 | Ito et al. ........................ 313/504 |
| 2004/0119419 A1 | 6/2004 | Kai et al. |
| 2004/0166761 A1 | 8/2004 | Seki et al. |
| 2005/0237780 A1 | 10/2005 | Sakai |
| 2005/0264186 A1 | 12/2005 | Seki et al. |
| 2005/0264187 A1 | 12/2005 | Seki et al. |
| 2005/0266169 A1 | 12/2005 | Seki et al. |
| 2006/0158107 A1 | 7/2006 | Kai et al. |
| 2006/0176261 A1 | 8/2006 | Nitta et al. |
| 2006/0283384 A1 | 12/2006 | Yamazaki et al. |
| 2007/0018152 A1 | 1/2007 | Seki et al. |
| 2007/0029929 A1 | 2/2007 | Nakamura et al. |
| 2007/0241664 A1 | 10/2007 | Sakamoto et al. |
| 2008/0036374 A1 | 2/2008 | Okano |
| 2008/0290789 A1 | 11/2008 | Kai et al. |
| 2008/0315760 A1 | 12/2008 | Seki et al. |
| 2009/0009075 A1 | 1/2009 | Seki et al. |
| 2009/0160322 A1 | 6/2009 | Yoshida et al. |
| 2009/0284144 A1 | 11/2009 | Fujioka et al. |
| 2009/0302333 A1 | 12/2009 | Seki et al. |
| 2010/0102343 A1 | 4/2010 | Ono et al. |
| 2010/0164372 A1 | 7/2010 | Kai et al. |
| 2011/0180821 A1 | 7/2011 | Matsushima |
| 2011/0198623 A1 | 8/2011 | Matsushima |
| 2011/0198624 A1 | 8/2011 | Matsushima |
| 2012/0025699 A1 | 2/2012 | Okumoto et al. |
| 2012/0091440 A1 | 4/2012 | Matsushima |
| 2012/0091483 A1 | 4/2012 | Matsushima |
| 2012/0138973 A1 | 6/2012 | Matsushima |
| 2012/0193658 A1 | 8/2012 | Matsushima |

FOREIGN PATENT DOCUMENTS

| | | |
|---|---|---|
| JP | 2002-358983 | 12/2002 |
| JP | 2004-192935 | 7/2004 |
| JP | 2005-267984 | 9/2005 |
| JP | 2006-140205 | 6/2006 |
| JP | 2006-185869 | 7/2006 |
| JP | 2007-073499 | 3/2007 |
| JP | 2007-165167 | 6/2007 |
| JP | 2007-287354 | 11/2007 |
| JP | 2007-310156 | 11/2007 |
| JP | 2007-311235 | 11/2007 |
| JP | 2009-054608 | 3/2009 |
| JP | 2009-277578 | 11/2009 |
| JP | 2009-277590 | 11/2009 |
| JP | 2010-225515 | 10/2010 |
| WO | 99/12397 | 3/1999 |
| WO | 2008/105153 | 9/2008 |

OTHER PUBLICATIONS

U.S. Appl. No. 13/309,775 to Hideaki Matsushima, filed Dec. 2, 2011.
U.S. Appl. No. 13/309,768 to Hideaki Matsushima, filed Dec. 2, 2011.
U.S. Appl. No. 13/313,214 to Hideaki Matsushima, filed Dec. 7, 2011.
U.S. Appl. No. 13/091,652 to Hideaki Matsushima, filed Apr. 21, 2011.
U.S. Appl. No. 13/082,674 to Hideaki Matsushima, filed Apr. 8, 2011.
U.S. Appl. No. 13/091,667 to Hideaki Matsushima, filed Apr. 21, 2011.
U.S. Appl. No. 13/434,070 to Hideaki Matsushima, filed Mar. 29, 2012.
International Search Report in PCT/JP2010/006126, mailing date of Jan. 18, 2011.
International Search Report in PCT/JP2010/006139, mailing date of Jan. 18, 2011.
International Search Report in PCT/JP2010/006144, mailing date of Jan. 18, 2011.
International Search Report in PCT/JP2010/006149, mailing date of Dec. 28, 2010.
United States Office Action in U.S. Appl. No. 13/082,674, dated Oct. 17, 2012.
United States Office Action in U.S. Appl. No. 13/091,667, dated Oct. 17, 2012.
International Search Report in PCT/JP2010/006125, mailing date of Dec. 7, 2010.
International Search Report in PCT/JP2010/006143, mailing date of Jan. 11, 2011.
International Preliminary Examination Report in PCT/JP2010/006125, mailing date of Dec. 12, 2011.
International Preliminary Examination Report in PCT/JP2010/006143, mailing date of Dec. 8, 2011.
International Search Report in PCT/JP2009/007082, mail date is Mar. 2, 2010.
International Search Report in PCT/JP2009/007092, mail date is Mar. 2, 2010.
International Search Report in PCT/JP2009/007118, mail date is Mar. 2, 2010.
United States Office Action in U.S. Appl. No. 13/434,070, dated Apr. 26, 2013.
Notice of Allowance in U.S. Appl. No. 13/082,674, dated Jun. 17, 2013.
Notice of Allowance in U.S. Appl. No. 13/091,667, dated Jun. 12, 2013.
Korean Office Action from Korean Patent Office in Korean Patent Application No. 2011-7029074, dated May 27, 2013.
U.S. Appl. No. 13/717,930 to Hideaki Matsushima, filed Dec. 28, 2012.
U.S. Appl. No. 13/716,744 to Hideaki Matsushima, filed Dec. 17, 2012.
United States Office Action in U.S. Appl. No. 13/091,652, dated Mar. 26, 2013.
United States Office Action in U.S. Appl. No. 13/082,674, dated Mar. 21, 2013.
United States Office Action in U.S. Appl. No. 13/091,667, dated Mar. 25, 2013.
United States Office Action in U.S. Appl. No. 13/313,214, dated Mar. 12, 2013.
United States Office Action in U.S. Appl. No. 13/309,775, dated Mar. 4, 2013.
United States Office Action in U.S. Appl. No. 13/309,768, dated Feb. 28, 2013.

* cited by examiner

FIG. 6

| Taper angle (θ) | Small ←——————————————→ Large |
|---|---|
| Pinning location (H) | Low ←——————————————→ High |
| Film thickness (T) | Thick ←——————————————→ Thin |

| | Sample 4 | Sample 5 |
|---|---|---|
| Bank height [μm] | 0.7 | 1.0 |
| Contact angle [°] | 43 | 47 |
| Taper angle [°] | 28 | 50 |
| Film thickness distribution |  |  | ent
ORGANIC LIGHT-EMITTING PANEL FOR CONTROLLING AN ORGANIC LIGHT EMITTING LAYER THICKNESS, AND ORGANIC DISPLAY DEVICE

CROSS REFERENCE TO RELATED APPLICATION

This is a continuation application of PCT Application No. PCT/W2010/006145 filed on Oct. 15, 2010, designating the United States of America, the disclosure of which, including the specification, drawings and claims, is incorporated herein by reference in its entirety.

TECHNICAL FIELD

The present invention relates to an organic light-emitting panel and a manufacturing method thereof, and an organic display device.

BACKGROUND ART

In recent years, progress has been made in the research and development of display devices that use the phenomenon of electroluminescence occurring in organic material. Each pixel of such a display device is composed of an anode and a cathode with an organic light-emitting layer therebetween. For driving the display device, holes are injected through the anode and electrons are injected through the cathode. Then, holes and electrons recombine in the organic light-emitting layer, and light is emitted.

Banks composed of insulating material partition the organic light-emitting layer between adjacent pixels. The organic light-emitting layer is formed by dripping ink that includes organic light-emitting material into each region partitioned by the banks and drying the ink.

However, it is problematic to even out the film thickness of the organic light-emitting layer formed in this way.

To even out the film thickness of the organic light-emitting layer, Patent Literature 1 for example recites technology to provide a convexity on the surface of the bank in order to control the pinning location of the ink. In other words, using the technology suggested in Patent Literature 1, the pinning location of the ink dripped in one pixel can be set to the convexity. As a result, uniform film thickness can be guaranteed to a certain degree.

CITATION LIST

Patent Literature

[Patent Literature 1] Japanese Patent Application Publication No. 2007-311235

SUMMARY OF INVENTION

Technical Problem

It is considered difficult, however, to use the technology suggested in Patent Literature 1 over the panel of a display device to form a minute convexity to a high degree of precision in each panel region or each bank surface as required, by grasping in advance how film shape is expected to be uneven. Therefore, it is not easy to maintain the organic light-emitting layer at a uniform film thickness over the entire panel of a display device.

It is an object of the present invention to solve the above problems by providing a display device, and a manufacturing method thereof, that has a uniform film thickness in the organic light-emitting layer across the entire panel and has a substantially even luminance within the panel.

Solution to Problem

In order to solve the above problems, an organic light-emitting panel according to one aspect of the present invention has the following structure.

The organic light-emitting panel according to the aspect of the present invention includes a first pixel, a second pixel, a non-light-emitting cell, a first bank, and a second bank.

The first pixel comprises a first, a second, and a third light-emitting cell consecutively arranged for light emission in colors different from each other and applied with ink corresponding to a first, a second, and a third luminescent color, the second light-emitting cell arranged between the first and the third light-emitting cell. Each of the first, the second, and the third light-emitting cell comprises: a base layer including a first electrode; an organic light-emitting layer layered above the base layer and applied with ink including organic light-emitting material of the corresponding luminescent color; a second electrode disposed opposite the base layer with the organic light-emitting layer in between; and a plurality of banks formed above the base layer as partitions between adjacent light-emitting cells. The second pixel, which is different from the first pixel, comprises a first, a second, and a third light-emitting cell consecutively arranged for light emission in colors different from each other and applied with ink corresponding to a first, a second, and a third luminescent color, the second light-emitting cell arranged between the first and the third light-emitting cell. Each of the first, the second, and the third light-emitting cell comprises: the base layer including a first electrode; an organic light-emitting layer layered above the base layer and applied with ink including the organic light-emitting material of the corresponding luminescent color; the second electrode disposed opposite the base layer with the organic light-emitting layer in between; and a plurality of banks formed above the base layer as partitions between adjacent light-emitting cells.

The non-light-emitting cell, which is between the third light-emitting cell of the first pixel and the first light-emitting cell of the second pixel, does not include the organic light-emitting layer and includes the second electrode and a third electrode, the third electrode isolated from the first electrode and electrically connected to the second electrode.

The first bank, which is different from the plurality of banks, is formed between the first pixel and the non-light-emitting cell as a partition between the third light-emitting cell of the first pixel and the non-light-emitting cell.

The second bank, which is different from the first bank and from the plurality of banks, is formed between the second pixel and the non-light-emitting cell as a partition between the first light-emitting cell of the second pixel and the non-light-emitting cell.

In the above structure, with respect to two opposing banks defining the third light-emitting cell of the first pixel, an inclination angle of a wall facing the third light-emitting cell of the first pixel in the first bank located closer to the non-light-emitting cell is larger than an inclination angle of a wall facing the third light-emitting cell of the first pixel in the bank located closer to the second light-emitting cell. Furthermore, with respect to two opposing banks defining the first light-emitting cell of the second pixel, an inclination angle of a wall facing the first light-emitting cell of the second pixel in the second bank located closer to the non-light-emitting cell is equivalent to an inclination angle of a wall facing the first light-emitting cell of the second pixel in the bank located closer to the second light-emitting cell.

Advantageous Effects of Invention

The organic light-emitting panel according to the above aspect of the present invention has the structure that, with respect to two opposing banks defining the third light-emitting cell of the first pixel, an inclination angle of a wall facing the third light-emitting cell of the first pixel in the first bank located closer to the non-light-emitting cell is larger than an inclination angle of a wall facing the third light-emitting cell of the first pixel in the bank located closer to the second light-emitting cell. With the above structure, with respect to the two opposing banks defining the third light-emitting cell of the first pixel when ink for forming an organic light-emitting layer is dripping, the height of a pinning location of the ink in the wall facing the third light-emitting cell of the first pixel in the first bank becomes higher than a pinning location of the ink in the wall facing the third light-emitting cell of the first pixel in the bank located closer to the second light-emitting cell. By making the pinning location high as mentioned above, the organic light-emitting panel according to the aspect of the present invention is capable of preventing uneven film thickness in the third light-emitting cell of the first pixel of the organic light-emitting layer, despite the fact that the film thickness of a section in the third light-emitting cell of the first pixel adjacent to the first bank tends to become relatively thick due to non-uniform vapor concentration distribution when the ink for forming the organic light-emitting layer is dripping.

The organic light-emitting panel according to the above aspect of the present invention also has the structure that, with respect to two opposing banks defining the first light-emitting cell of the second pixel, an inclination angle of a wall facing the first light-emitting cell of the second pixel in the second bank located closer to the non-light-emitting cell is equivalent to an inclination angle of a wall facing the first light-emitting cell of the second pixel in the bank located closer to the second light-emitting cell.

With respect to the first light-emitting cell of the second pixel when the ink for forming the organic light-emitting layer is dripping, the first light-emitting cell of the second pixel is adjacent to the non-light-emitting cell at one side and to the second light-emitting cell at another side. Accordingly, during the ink application, such ink is not present on either side of the first light-emitting cell of the second pixel, and therefore significant non-uniformity in the vapor concentration distribution cannot be seen. For this reason, by forming the inclination angle of the wall facing the first light-emitting cell of the second pixel in the second bank to be equivalent to the inclination angle of the wall facing the first light-emitting cell of the second pixel in the bank located closer to the second light-emitting cell, the height of a pinning location of the ink in the wall facing the first light-emitting cell of the second pixel in the second bank becomes equivalent to the height of a pinning location of the ink in the wall facing the first light-emitting cell of the second pixel in the bank located closer to the second light-emitting cell. Consequently, the organic light-emitting panel according to the aspect of the present invention is also capable of preventing uneven film thickness in the first light-emitting cell of the second pixel of the organic light-emitting layer.

As a result, the organic light-emitting panel according to the aspect of the present invention prevents uneven film thickness in the organic light-emitting layer on the front of the panel, for example both in the third light-emitting cell of the first pixel and in the first light-emitting cell of the second pixel, which allows for excellent light-emitting characteristics to be obtained.

BRIEF DESCRIPTION OF DRAWINGS

FIG. 6 summarizes the relationship between the inclination angle of the bank (taper angle) θ, the pinning height H, and the film thickness T of the organic light-emitting layer.

DESCRIPTION OF EMBODIMENTS

Figure 1:
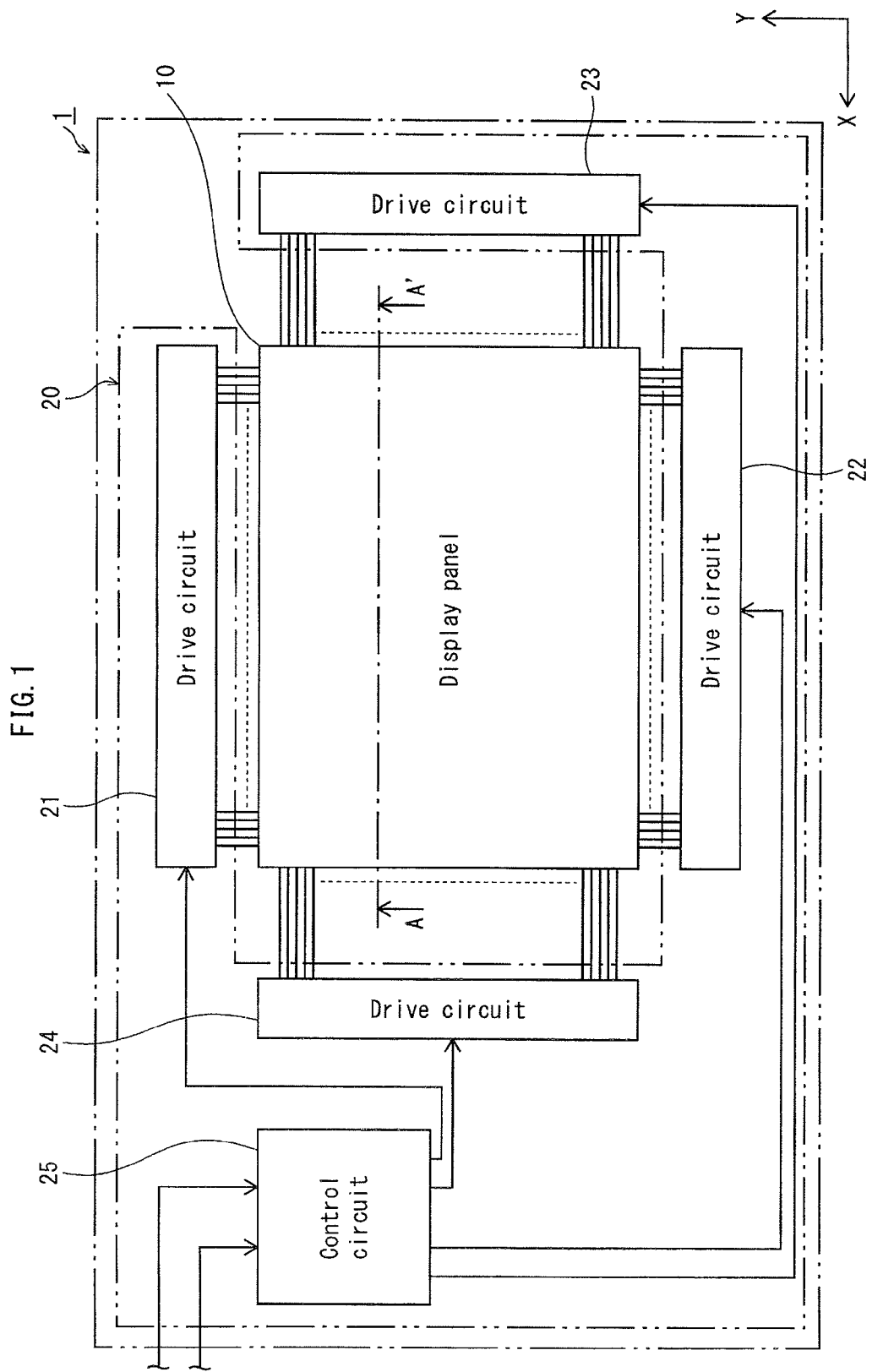
FIG. 1 is a block diagram showing the configuration of an organic display device 1 according to the Embodiment of the present invention.

[Outline of Aspects of the Present Invention]

An organic light-emitting according to one aspect of the present invention includes a first pixel, a second pixel, a non-light-emitting cell, a first bank, a first bank, and a second bank.

The first pixel comprises a first, a second, and a third light-emitting cell consecutively arranged for light emission in colors different from each other and applied with ink corresponding to a first, a second, and a third luminescent color, the second light-emitting cell arranged between the first and the third light-emitting cell. Each of the first, the second, and the third light-emitting cell comprises: a base layer including a first electrode; an organic light-emitting layer layered above the base layer and applied with ink including organic light-emitting material of the corresponding luminescent color; a second electrode disposed opposite the base layer with the organic light-emitting layer in between; and a plurality of banks formed above the base layer as partitions between adjacent light-emitting cells. The second pixel, which is different from the first pixel, comprises a first, a second, and a third light-emitting cell consecutively arranged for light emission in colors different from each other and applied with ink corresponding to a first, a second, and a third luminescent color, the second light-emitting cell arranged between the first and the third light-emitting cell. Each of the first, the second, and the third light-emitting cell comprises: the base layer including a first electrode; an organic light-emitting layer layered above the base layer and applied with ink including the organic light-emitting material of the corresponding luminescent color; the second electrode disposed opposite the base layer with the organic light-emitting layer in between; and a plurality of banks formed above the base layer as partitions between adjacent light-emitting cells.

The non-light-emitting cell, which is between the third light-emitting cell of the first pixel and the first light-emitting cell of the second pixel, does not include the organic light-emitting layer and includes the second electrode and a third electrode, the third electrode isolated from the first electrode and electrically connected to the second electrode.

The first bank, which is different from the plurality of banks included in the first and the second pixel, is formed between the first pixel and the non-light-emitting cell as a partition between the third light-emitting cell of the first pixel and the non-light-emitting cell.

The second bank, which is different from the first bank and from the plurality of banks included in the first and the second pixel, is formed between the second pixel and the non-light-emitting cell as a partition between the first light-emitting cell of the second pixel and the non-light-emitting cell.

In the above structure: with respect to two opposing banks (i.e. the first bank and the bank included in the first pixel) defining the third light-emitting cell of the first pixel, an inclination angle of a wall facing the third light-emitting cell of the first pixel in the first bank located closer to the non-light-emitting cell is larger than an inclination angle of a wall facing the third light-emitting cell of the first pixel in the bank located closer to the second light-emitting cell; and with respect to two opposing banks (i.e. the second bank and the bank included in the second pixel) defining the first light-emitting cell of the second pixel, an inclination angle of a wall facing the first light-emitting cell of the second pixel in the second bank located closer to the non-light-emitting cell is equivalent to an inclination angle of a wall facing the first light-emitting cell of the second pixel in the bank located closer to the second light-emitting cell.

Thus, the organic light-emitting panel according to the above aspect of the present invention has the structure that, with respect to the two opposing banks (i.e. the first bank and the bank included in the first pixel) defining the third light-emitting cell of the first pixel, the inclination angle of the wall facing the third light-emitting cell of the first pixel in the first bank located closer to the non-light-emitting cell is larger than the inclination angle of the wall facing the third light-emitting cell of the first pixel in the bank located closer to the second light-emitting cell. With the above structure, with respect to the two opposing banks defining the third light-emitting cell of the first pixel when the ink for forming an organic light-emitting layer is dripping, the height of a pinning location of the ink in the wall facing the third light-emitting cell of the first pixel in the first bank becomes higher than a pinning location of the ink in the wall facing the third light-emitting cell of the first pixel in the bank located closer to the second light-emitting cell. By making the pinning location high as mentioned above, the organic light-emitting panel according to the aspect of the present invention is capable of preventing uneven film thickness in the third light-emitting cell of the first pixel of the organic light-emitting layer, despite the fact that the film thickness of a section in the third light-emitting cell of the first pixel adjacent to the first bank tends to become relatively thick due to non-uniform vapor concentration distribution when the ink for forming the organic light-emitting layer is dripping.

The organic light-emitting panel according to the aspect of the present invention also has the structure that, with respect to the two opposing banks (i.e. the second bank and the bank included in the second pixel) defining the first light-emitting cell of the second pixel, the inclination angle of the wall facing the first light-emitting cell of the second pixel in the second bank located closer to the non-light-emitting cell is equivalent to the inclination angle of the wall facing the first light-emitting cell of the second pixel in the bank located closer to the second light-emitting cell.

With respect to the first light-emitting cell of the second pixel when the ink for forming the organic light-emitting layer is dripping, the first light-emitting cell of the second pixel is adjacent to the non-light-emitting cell at one side and to the second light-emitting cell at another side. Accordingly, during the ink application, such ink is not present on either side of the first light-emitting cell of the second pixel, and therefore significant non-uniformity in the vapor concentration distribution cannot be seen. For this reason, by forming the inclination angle of the wall facing the first light-emitting cell of the second pixel in the second bank to be equivalent to the inclination angle of the wall facing the first light-emitting cell of the second pixel in the bank located closer to the second light-emitting cell, the height of a pinning location of the ink in the wall facing the first light-emitting cell of the second pixel in the second bank becomes equivalent to the height of a pinning location of the ink in the wall facing the first light-emitting cell of the second pixel in the bank located closer to the second light-emitting cell. Consequently, the organic light-emitting panel according to the aspect of the present invention is also capable of preventing uneven film thickness in the first light-emitting cell of the second pixel of the organic light-emitting layer.

As a result, the organic light-emitting panel according to the aspect of the present invention prevents uneven film thickness in the organic light-emitting layer on the front of the panel, for example both in the third light-emitting cell of the first pixel and in the first light-emitting cell of the second pixel, which allows for excellent light-emitting characteristics to be obtained.

Note that the term "equivalent" above does not mean exact mathematical equivalence, but rather takes factors such as tolerance when manufacturing the organic light-emitting panel into account. Specifically, the term "equivalent" refers to making the inclination angles equivalent within practical tolerance for luminous efficiency (uneven luminance) between the pixels in the central region and peripheral region of the panel. This applies throughout the following description.

The organic light-emitting panel according to the above aspect of the present invention may further adopt the structure that the inclination angle of the wall facing the third light-emitting cell of the first pixel in the first bank is larger than an inclination angle of a wall facing the non-light-emitting cell in the first bank, and the inclination angle of the wall facing the first light-emitting cell of the second pixel in the second bank is equivalent to an inclination angle of a wall facing the non-light-emitting cell in the second bank.

With the above structure, since the inclination angle of the wall facing the third light-emitting cell of the first pixel in the first bank is larger than the inclination angle of the wall facing the non-light-emitting cell in the first bank, when the ink for forming the organic light-emitting layer is dripping, the height of a pinning location of the ink in the wall facing the third light-emitting cell of the first pixel in the first bank becomes higher than a pinning location of the ink in the opposite wall in the first bank. By making the pinning location high as mentioned above, the present organic light-emitting panel is capable of preventing uneven film thickness in the third light-emitting cell of the first pixel of the organic light-emitting layer, despite the fact that the film thickness of a section in the third light-emitting cell of the first pixel adjacent to the first bank tends to become relatively thick due to non-uniform vapor concentration distribution when the ink for forming the organic light-emitting layer is dripping.

Furthermore, with the above structure, the inclination angle of the wall facing the first light-emitting cell of the second pixel in the second bank is equivalent to the inclination angle of the wall facing the non-light-emitting cell in the second bank. With respect to the first light-emitting cell of the second pixel when the ink for forming the organic light-emitting layer is dripping, the first light-emitting cell of the second pixel is adjacent to the non-light-emitting cell at one side and to the second light-emitting cell of the second pixel at another side. Accordingly, during the ink application, such ink is not present on either side of the first light-emitting cell of the second pixel, and therefore significant non-uniformity in the vapor concentration distribution cannot be seen. For this reason, by forming the inclination angle of the wall facing the first light-emitting cell of the second pixel in the second bank to be equivalent to the inclination angle of the wall facing the non-light-emitting cell in the second bank, the height of a pinning location of the ink in the wall facing the first light-emitting cell of the second pixel in the second bank becomes equivalent to the height of a pinning location of the ink in the opposite wall in the second bank. Consequently, the organic light-emitting panel according to the aspect of the present invention is also capable of preventing uneven film thickness in the first light-emitting cell of the second pixel of the organic light-emitting layer.

Thus, with the above structure, the present organic light-emitting panel prevents uneven film thickness in the organic light-emitting layer on the front of the panel, for example both in the third light-emitting cell of the first pixel and in the first light-emitting cell of the second pixel, which allows for excellent light-emitting characteristics to be obtained.

The organic light-emitting panel according to the above aspect of the present invention may further adopt the structure that, in each of the first and the second pixel, inclination angles of opposing walls in two opposing banks defining the second light-emitting cell are different from each other, and an inclination angle of a wall facing the second light-emitting cell in the bank located closer to the third light-emitting cell is larger than an inclination angle of a wall facing the second light-emitting cell in the bank located closer to the first light-emitting cell.

In each of the first and the second pixel when the ink is dripped for forming the organic light-emitting layer of the second light-emitting cell, the first light-emitting cell has been already applied with the ink, whereas the third light-emitting cell has not yet been applied with the ink. Consequently, vapor concentration distribution is not uniform when the ink is applied to the second light-emitting cell.

To address the uneven vapor concentration distribution, the inclination angle of the wall facing the second light-emitting cell in the bank located closer to the third light-emitting cell, where the vapor concentration is relatively low, is formed to be large. As a result, the height of a pinning location of the ink in the wall facing the second light-emitting cell in the bank located closer to the third light-emitting cell is relatively higher than the height of a pinning location of the ink in the opposing wall. With the above structure, the organic light-emitting panel according to the above aspect of the present invention is capable of preventing uneven film thickness of the light-emitting layer in the second light-emitting cell of each of the first and the second pixel.

The organic light-emitting panel according to the above aspect of the present invention may further adopt the structure that an inclination angle of a wall facing the non-light-emitting cell in the first bank is equivalent to an inclination angle of a wall facing the non-light-emitting cell in the second bank.

Adopting the above structure prevents problems of disconnection of the second electrode and the production of leak current in a boundary area between the first and the second bank in the non-light-emitting cell. More particularly, since in the first and the second bank, the inclination angle of the walls facing the non-light-emitting cell is relatively smaller than the inclination angle of the wall facing the third light-emitting cell of the first pixel and the inclination angle of the wall facing the first light-emitting cell of the second pixel, the second electrode, which is formed over the first and the second bank, is prevented from suffering from the problems of disconnection and the production of leak current, whereby the electrical connection between the second and the third electrodes is assured. Furthermore, by forming the inclination angle of the wall facing the non-light-emitting cell in the first bank to be equivalent to the inclination angle of the wall facing the non-light-emitting cell in the second bank, the respective walls in the first and the second bank become identical in shape to each other with respect to the non-light-emitting cell. As a result, variation in electrical characteristics, e.g. electrical resistance, is reduced.

The organic light-emitting panel according to the above aspect of the present invention may further adopt the structure that, in each of the first and the second pixel, the organic light-emitting layer is formed by dripping the ink corresponding to the first, the second, and the third luminescent color to the first, the second, and the third light-emitting cell, respectively, in the stated order.

When the ink is sequentially dripped to the first, the second, and the third light-emitting cell in the stated order in this way, in each of the first and the second pixel, the film thickness in the organic light-emitting layer tends to become uneven between the second light-emitting cell, where the ink is dripped in the second round, and the third light-emitting cell, where the ink is dripped in the third round, due to the non-uniform vapor concentration distribution.

To avoid the above problem, forming the inclination angles of the respective walls in the first and the second bank, and other banks as mentioned above prevents uneven film thickness in the organic light-emitting layer in each of the first, the second, and the third light-emitting cell.

Thus, with the above structure, the organic light-emitting layer does not exhibit the uneven film thickness in each light-emitting cell of the first and the second pixel, which allows for excellent light-emitting characteristics to be obtained.

According to another aspect of the present invention, in the above organic light-emitting panel, it may be defined that each inclination angle is formed between a wall of the corresponding bank and an upper surface of the base layer (which corresponds to a first electrode, a hole injection transporting layer, or a hole injection layer) above which the bank is formed.

Another aspect of the present invention provides an organic display device including an organic light-emitting panel according to any of the above aspects. The organic display device according to this aspect of the present invention therefore provides the same advantageous effects as the organic light-emitting panel according to the aforementioned aspect of the present invention, i.e. preventing the uneven film thickness of the organic light-emitting layer, which allows for excellent light-emitting characteristics to be obtained.

Another aspect of the present invention provides a manufacturing method of an organic light-emitting panel including a first and a second pixel and a non-light-emitting cell between the first and the second pixel, the first and the second pixel each comprising a first, a second, and a third light-emitting cell, the second light-emitting cell arranged between the first and the third light-emitting cell. The manufacturing method comprises the following steps.

A base layer is formed over a substrate, the base layer including a first electrode (a first step).

Photoresist material is layered above the base layer (a second step).

Via mask exposure and patterning of the photoresist material layered above the base layer, (i) a first, a second, and a third opening respectively corresponding to the first, the second, and the third light-emitting cell as the first pixel and a plurality of banks as partitions between adjacent light-emitting cells, (ii) a first, a second, and a third opening respectively corresponding to the first, the second, and the third light-emitting cell as the second pixel and a plurality of banks as partitions between adjacent light-emitting cells, (iii) an opening corresponding to the non-light-emitting cell between the third light-emitting cell of the first pixel and the first light-emitting cell of the second pixel, and (iv) a first and a second bank, the first bank formed as a partition between the first pixel and the non-light-emitting cell, the second bank formed as a partition between the second pixel and the non-light-emitting cell, are formed (a third step).

An organic light-emitting layer is formed by dripping ink that includes organic light-emitting material to each of the first, the second, and the third opening in the first and the second pixel and drying the ink (a fourth step).

A second electrode is formed above the organic light-emitting layer (a fifth step).

In the third step of the manufacturing method of an organic light-emitting panel according to the above aspect of the present invention, with respect to two opposing banks (i.e. the first bank and the bank included in the first pixel) defining the third light-emitting cell of the first pixel, an inclination angle of a wall facing the third light-emitting cell of the first pixel in the bank located closer to the non-light-emitting cell is formed to be larger than an inclination angle of a wall facing the third light-emitting cell of the first pixel in the bank located closer to the second light-emitting cell.

Furthermore, in the third step, with respect to two opposing banks (i.e. the second bank and the bank included in the second pixel) defining the first light-emitting cell of the second pixel, an inclination angle of a wall facing the first light-emitting cell of the second pixel in the bank located closer to the non-light-emitting cell is formed to be equivalent to an inclination angle of a wall facing the first light-emitting cell of the second pixel in the bank located closer to the second light-emitting cell.

Furthermore, in the fourth step in the manufacturing method of an organic light-emitting panel according to the above aspect of the present invention, in each of the first and the second pixel, the organic light-emitting layer is formed by applying ink corresponding to a first, a second, and a third luminescent color to the first, the second, and the third light-emitting cell, respectively, in the stated order.

With the manufacturing method, an organic light-emitting panel is formed which is characterized in that: with respect to the two opposing banks defining the third light-emitting cell of the first pixel, the inclination angle of the wall facing the third light-emitting cell of the first pixel in the bank located closer to the non-light-emitting cell is formed to be larger than the inclination angle of the wall facing the third light-emitting cell of the first pixel in the bank located closer to the second light-emitting cell; and with respect to the two opposing banks defining the first light-emitting cell of the second pixel, the inclination angle of the wall facing the first light-emitting cell of the second pixel in the bank located closer to the non-light-emitting cell is formed to be equivalent to the inclination angle of the wall facing the first light-emitting cell of the second pixel in the bank located closer to the second light-emitting cell. As a result, the uneven film thickness of the organic light-emitting layer, which is caused by the vapor concentration distribution state when ink is dripping, is effectively prevented.

Thus, according to the manufacturing method of an organic light-emitting panel according to the above aspect of the present invention, an organic light-emitting panel with excellent light-emitting characteristics is manufactured.

The manufacturing method of an organic light-emitting panel according to the above aspect of the present invention may further adopt the following methods as a specific way to increase the inclination angles of the above-mentioned walls in the banks (including the first and the second bank).

As an example of such methods that the manufacturing method of an organic light-emitting panel according to the above aspect of the present invention may adopt, when performing the mask exposure of the photoresist material in the third step, with respect to the two opposing banks (i.e. the first bank and the bank included in the first pixel) defining the third light-emitting cell of the first pixel, the inclination angle of the wall facing the third light-emitting cell of the first pixel in the bank located closer to the non-light-emitting cell is formed to be larger than the inclination angle of the wall facing the third light-emitting cell of the first pixel in the bank located closer to the second light-emitting cell, by setting an exposure amount in a section corresponding to the wall facing the third light-emitting cell of the first pixel in the bank located closer to the non-light-emitting cell larger than an exposure amount in a section corresponding to the wall facing the third light-emitting cell of the first pixel in the bank located closer to the second light-emitting cell.

By thus using the mask in which the exposure amount is varied in the different sections, the inclination angles of the walls in the banks can be relatively adjusted.

As another example of such methods that the manufacturing method of an organic light-emitting panel according to the above aspect of the present invention may adopt, when performing the mask exposure of the photoresist material in the third step, with respect to the two opposing banks (i.e. the first bank and the bank included in the first pixel) defining the third light-emitting cell of the first pixel, the inclination angle of the wall facing the third light-emitting cell of the first pixel in the bank located closer to the non-light-emitting cell is formed to be larger than the inclination angle of the wall facing the third light-emitting cell of the first pixel in the bank located closer to the second light-emitting cell, by using a mask in which a degree of transparency in a section corresponding to the wall facing the third light-emitting cell of the first pixel in the bank located closer to the non-light-emitting cell is larger than a degree of transparency in a section corresponding to the wall facing the third light-emitting cell of the first pixel in the bank located closer to the second light-emitting cell.

By thus using the mask in which the degree of transparency is varied in the different sections, the inclination angles of the walls in the banks can be relatively adjusted.

As another example of such methods that the manufacturing method of an organic light-emitting panel according to the above aspect of the present invention may adopt, when exposing and developing the photoresist material in the third step, with respect to the two opposing banks (i.e. the first bank and the bank included in the first pixel) defining the third light-emitting cell of the first pixel, the inclination angle of the wall facing the third light-emitting cell of the first pixel in the bank located closer to the non-light-emitting cell is formed to be larger than the inclination angle of the wall facing the third light-emitting cell of the first pixel in the bank located closer to the second light-emitting cell, by exposing and developing the photoresist material to the two opposing banks defining the third light-emitting cell of the first pixel, and then additionally exposing the photoresist material in a section corresponding to the wall facing the third light-emitting cell of the first pixel in the bank located closer to the non-light-emitting cell.

By thus varying the number of times of exposure according to the corresponding sections, the inclination angles of the walls in the banks can be relatively increased.

Note that, in the above aspects of the present invention, the term "bank" refers to a bank portion formed as a partition between adjacent light-emitting cells or a bank portion formed as a partition between a pixel and a non-light-emitting cell.

[Process by which the Embodiment According to the Present Invention was Achieved]

Earnest study of the inventor of the present invention revealed the following with regard to the organic light-emitting display device recited in the [Background Art] section.

Figure 21:
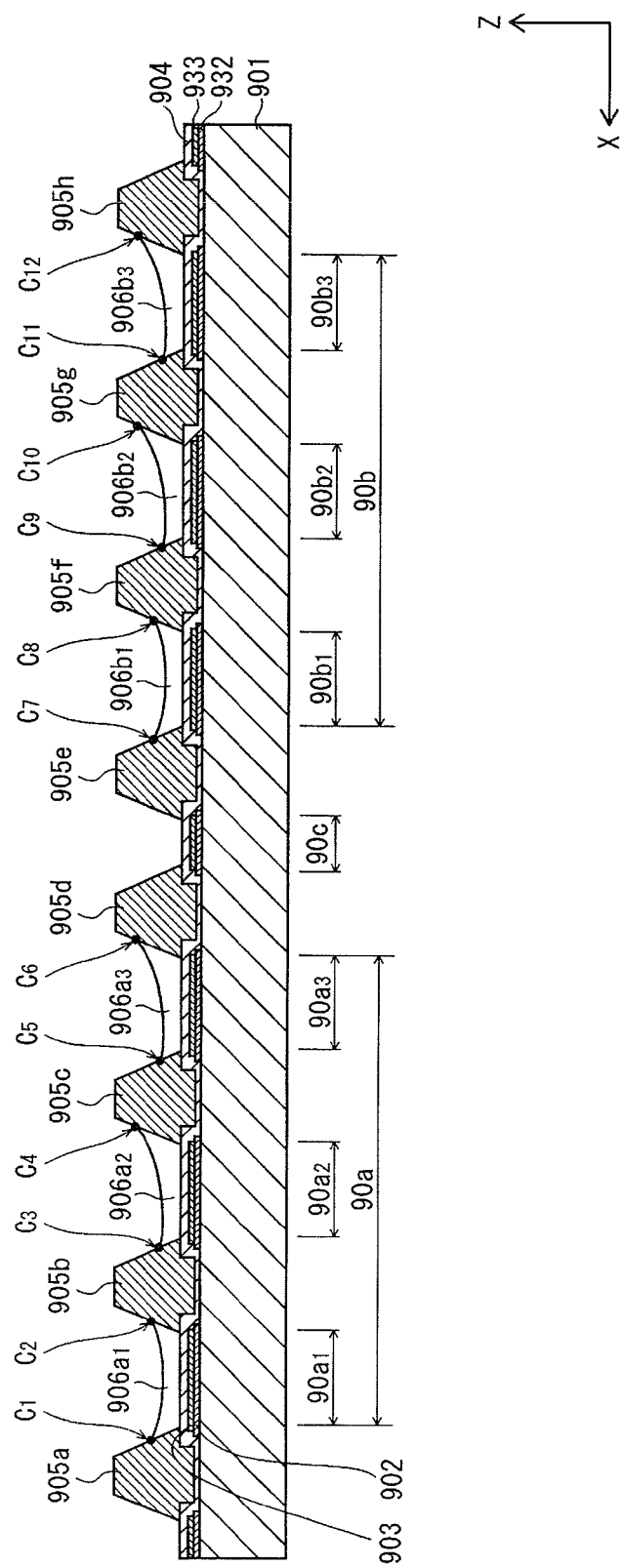
FIG. 21 is a schematic cross-section diagram showing an uneven distribution of film thickness of an organic light-emitting layer in each sub-pixel of pixels 90*a* and 90*b* in the display panel.

As shown in FIG. 21, in an X-axis direction, a pixel 90a and a pixel 90b are arranged with a non-light-emitting cell 90c therebetween. Each of the pixels 90a and 90b includes sub-pixels 90a1, 90a2, and sub-pixels 90a3, and 90b1, 90b2, and 90b3 corresponding to three light-emitting colors of red (R), green (G), and blue (B), respectively. In each of the sub-pixels 90a1, 90a2, 90a3, 90b1, 90b2, and 90b3, an anode 902 and electrode coating layer 903 are formed in this order on a substrate 901. A hole injection transporting layer 904 is further formed to coat the electrode coating layer 903 and the substrate 901, and over the hole-injection layer 904, organic light-emitting layers 906a1, 906a2, 906a3, 906b1, 906b2, and 906b3 are each layered for a corresponding light-emitting color. Banks 905a-905d, and 905e-905h are provided on the hole-injection layer 904 as partitions between the organic light-emitting layers 906a1, 906a2, 906a3, 906b1, 906b2, and 906b3.

On the other hand, although the non-light-emitting cell 90c includes a busbar 932 and an electrode coating layer 933, the non-light-emitting cell 90c does not include the organic light-emitting layer.

As shown in FIG. 21, the organic light-emitting panel according to conventional technology tends to have a less uniform film thickness at the organic light-emitting layer 906a2, 906a3, 906b2, and 906b3 at the sub-pixels 90a2, 90a3, 90b2, and 90b3 in the pixels 90a and 90b that are adjacent to the non-light-emitting cell 90c. Specifically, the surface of the organic light-emitting layer 906a2 located at the sub-pixel 90a2 becomes higher at a point $C_4$ near the bank 905c than at a point $C_3$ near the bank 905b, and the surface of the organic light-emitting layer 906a3 located at the sub-pixel 90a3 becomes higher at a point $C_6$ near the bank 905d than at a point $C_5$ near the bank 905c.

Similarly, the surface of the organic light-emitting layer 906b2 located at the sub-pixel 90b2 becomes higher at a point $C_{10}$ near the bank 905g than at a point $C_9$ near the bank 905f, and the surface of the organic light-emitting layer 906b3 located at the sub-pixel 90b3 becomes higher at a point $C_{12}$ near the bank 905h than at a point $C_{11}$ near the bank 905g.

On the other hand, in the sub-pixel 90a1 of the pixel 90a, the height of the surface of the organic light-emitting layer 906a1 at a point $C_1$ near the bank 905a becomes equivalent to that at a point $C_2$ near the bank 905b. Similarly, in the sub-pixel 90b1 of the pixel 90b, the height of the surface of the organic light-emitting layer 906b1 at a point $C_7$ near the bank 905e becomes equivalent to that at a point $C_8$ near the bank 905f.

Figure 22A:
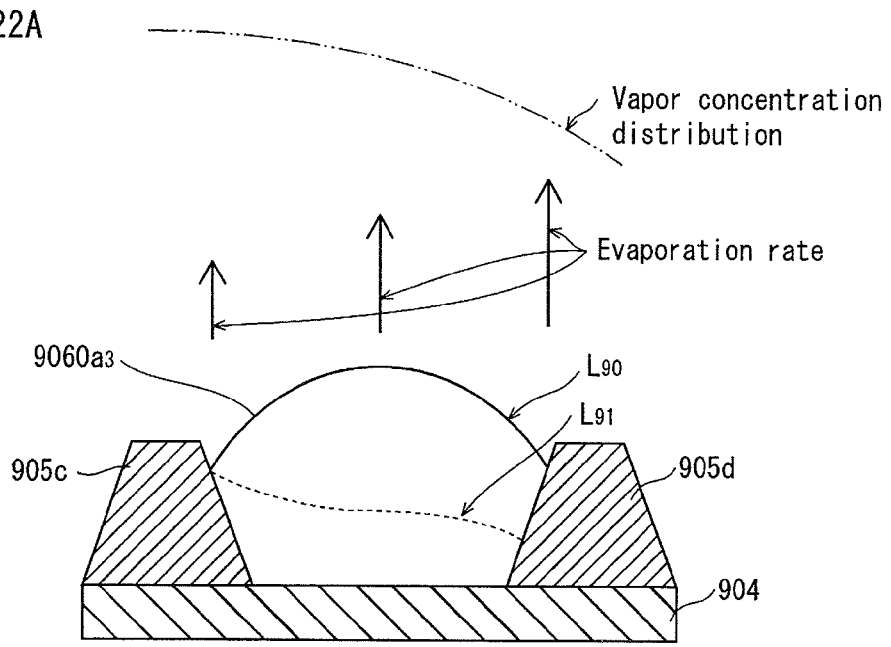
FIGS. 22A, 22B, and 22C are schematic cross-section diagrams showing a vapor concentration distribution when forming an organic light-emitting layer, and an uneven film shape during an ink drying process.

After repeated examination of the above phenomenon, the inventor determined that reduction in uniformity of film thickness in the organic light-emitting layer causes a non-uniform vapor concentration distribution during ink drying, as described below. Specifically, as shown in FIG. 22A, suppose a state in which ink 9060a3 for forming the organic light-emitting layer has been sprayed in an area defined between the bank 905c and the bank 905d, and the vapor concentration distribution at the right side of FIG. 22A is lower than at the left side as shown by a line with alternate long and two short dashes. In this case, the uneven film thickness in the organic light-emitting layer can be explained as follows. Note that the vapor concentration distribution is lower at the right side of FIG. 22A than at the left side mainly because of the following reasons. That is to say, the sub-pixel 90a2 at the left side of the bank 905c has been already applied with the ink (not shown), whereas the right side of the bank 905d is located next to the non-light-emitting cell 90c (refer to FIG. 21) which does not require ink spraying.

As shown by the surface profile L90 of ink 9060a3 in FIG. 22A, the ink 9060a3 is swollen up at the central region of the sub-pixel immediately after being dripped. When drying the ink, due to the non-uniform vapor concentration distribution as mentioned above, the evaporation rate varies in reverse proportion to the vapor concentration, and therefore it can be theoretically considered that the ink 9060a3 changes to have a surface profile $L_{91}$.

Figure 22B:
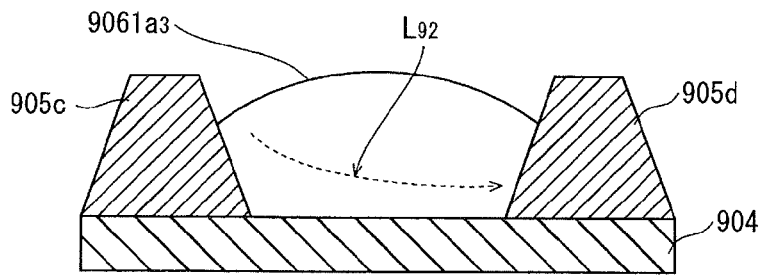
Figure 22C:
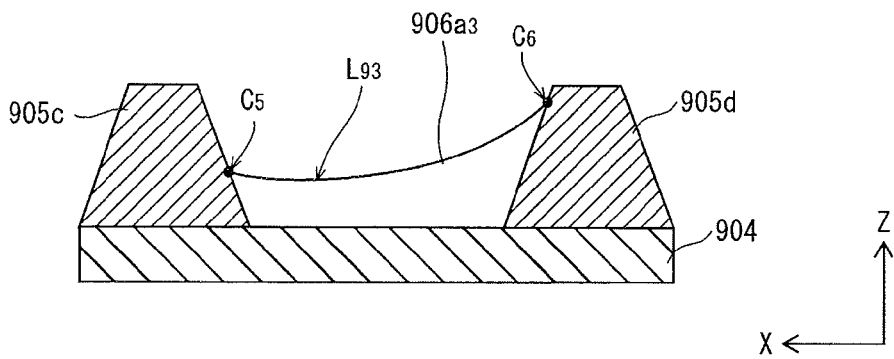

However, as shown in FIG. 22B, solvent in the ink 9061a3 flows during drying as shown by the dashed arrow $L_{92}$. This is because solvent flows to compensate for solvent that has evaporated (i.e. flows to minimize surface free energy), and along with the flow of the solvent, the solute (organic light-emitting material) also flows. Therefore, as shown in FIG. 22C, because of the non-uniform vapor concentration distribution, the organic light-emitting layer 906a3 with a surface profile $L_{93}$ that swells up as it approaches the right side of the sub-pixel (i.e. that is higher at the point $C_6$ than at the point $C_5$).

The inventor therefore deduced that, in an organic light-emitting display panel, uniformity of film thickness of the organic light-emitting layer decreases due to non-uniformity of vapor concentration distribution in ink drying during manufacturing.

The inventor also discovered technology to vary, within the panel, the pinning location of ink on a bank side wall by varying the inclination angle of the bank side wall, which improves uniformity of film thickness in the organic light-emitting layer.

[Embodiments]

The following describes an example of an embodiment of the present invention with reference to the drawings.

Note that the following Embodiment is simply an example to clearly illustrate a structure of the present invention and the effects and advantages thereof. The present invention is in no way limited to the following Embodiment except in its essential characteristic elements.

1. Configuration of Display Device 1

The overall structure of the display device 1 according to the present Embodiment is described with reference to FIG. 1.

As shown in FIG. 1, the display device (organic display device) 1 includes a display panel unit 10 and a drive control unit 20 connected to the display panel unit 10. The display panel unit 10 is an organic EL panel that uses the phenomenon of electroluminescence occurring in organic material and is composed of an array of a plurality of pixels arranged two-dimensionally in X and Y directions.

The drive control unit 20 is composed of four drive circuits 21-24 and a control circuit 25.

Note that in an actual display device 1, the placement of the drive control unit 20 with respect to the display panel unit 10 is not limited in this way.

2. Structure of Display Panel 10

Figure 2:
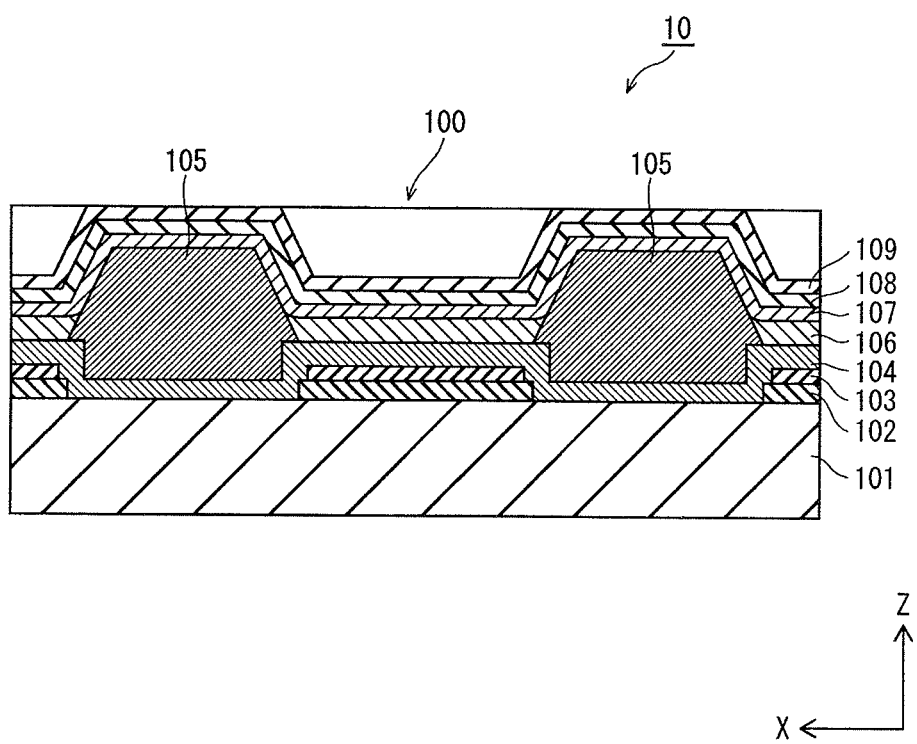
FIG. 2 is a schematic cross-section diagram showing a sub-pixel 100 in a display panel 10.

The structure of the display panel 10 is described with reference to FIG. 2. Note that, as an example, the display panel 10 in the present Embodiment is a top emission type organic light-emitting panel composed of a plurality sub-pixels that are each provided with an organic light-emitting layer having a luminescent color of either red (R), green (G), or blue (B) arranged in a matrix. FIG. 2 depicts one sub-pixel 100 in one pixel.

As shown in FIG. 2, in the display panel 10, an anode 102 is formed on a TFT substrate (hereinafter simply referred to as a "substrate")101, and an electrode coating layer 103 and hole injection transporting layer 104 are layered on the anode 102 in this order. Note that the anode 102 and electrode coating layer 103 are formed separately for each sub-pixel 100.

On the hole injection transporting layer 104, banks 105 formed from insulating material are established as partitions between sub-pixels 100. An organic light-emitting layer 106 is formed in the region in each sub-pixel 100 partitioned by the banks 105, and an electron injection layer 107, a cathode 108, and a passivation layer 109 are layered on the organic light-emitting layer 106 in this order.

a) Substrate 101

The substrate 101 is formed with a base of an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc. Although not shown, in the substrate 101, a TFT layer, a passivation film, an interlayer insulation film, etc. are laminated.

b) Anode 102

The anode 102 is composed of a single layer or of a laminate of a plurality of layers of a conductive material, such as Al (aluminum) or Al alloy, Ag (silver), APC (alloy of silver, palladium, and copper), ARA (alloy of silver, rubidium, and gold), MoCr (alloy of molybdenum and chromium), NiCr (alloy of nickel and chromium), etc. Note that in the case of a top emission type panel such as in the present Embodiment, it is preferable that the anode 102 be formed with highly reflective material.

c) Electrode Coating Layer 103

The electrode coating layer 103 is formed, for example, using indium tin oxide (ITO) and covers at least part of a surface of the anode 102, the surface being on the upper side of the anode 102 along the Z axis.

d) Hole Injection Transporting Layer 104

The hole injection transporting layer 104 is a layer of an oxide of a metal such as silver (Ag), molybdenum (Mo), chromium (Cr), vanadium (V), tungsten (W), nickel (Ni), iridium (Ir), etc. The hole injection transporting layer 104 may also be formed with conductive polymer material such as PEDOT (a mixture of polythiophene and polystyrene sulfonic acid). A hole injection transporting layer 104 formed from such a metal oxide has the function of assisting with hole generation and of injecting and transporting holes stably into the organic light-emitting layer 106. The hole injection transporting layer 104 has a high work function.

When the hole injection transporting layer 104 is formed from an oxide of a transition metal, a plurality of levels can be occupied since there are a plurality of oxidation numbers. This makes hole injection easy and allows for reduction of driving voltage.

e) Banks 105

The banks 105 are formed with an organic material such as resin and have insulating properties. Examples of the organic material used to form the banks 105 include acrylic resin, polyimide resin, novolac-type phenolic resin, etc. It is also preferable that the banks 105 have organic solvent resistance.

Furthermore, since the banks 105 are etched and baked when formed, it is preferable that the banks be formed from highly resistant material that will not change in shape or quality during the etching and baking processes. To provide the banks with liquid repellency, the side walls can be fluoridated.

Note that as the insulating material used in forming the banks 105, any liquid repellent material with a resistivity of $10^5$ Ω·cm or greater can be used, starting with the above materials. Using a material with a resistivity of less than $10^5$ Ω·cm leads to production of leak current between the anode 102 and the cathode 108, or between adjacent sub-pixels 100, which causes a variety of problems such as increased power consumption.

Furthermore, if a hydrophilic material is used to form the banks 105, the difference in hydro-philicity/hydro-repellency between the side wall of the banks 105 and the surface of the hole injection transporting layer 104 becomes small, and it thus becomes difficult to selectively maintain the ink, which includes an organic substance for forming the organic light-emitting layer 106, at the opening of the banks 105.

The structure of the banks 105 need not be a single layer as shown in FIG. 2, but may adopt a two or more layered structure. In such a case, the above materials may be combined for each layer, or layers may alternate between non-organic and organic material.

f) Organic Light-emitting Layer 106

The organic light-emitting layer 106 has a function of emitting light when an excitation state is produced by the recombination of holes injected through the anode 102 with electrons injected through the cathode 108. The material used to form the organic light-emitting layer 106 needs to be a light-emitting organic material, a film of which can be formed by wet printing.

Specifically, it is preferable that the organic light-emitting layer 106 be formed from a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H05-163488.

g) Electron Injection Layer 107

The electron injection layer 107 has the function of transporting electrons injected through the cathode 108 to the organic light-emitting layer 106 and is preferably formed, for example, of barium, phthalocyanine, lithium fluoride, or a combination thereof.

h) Cathode 108

The cathode 108 is formed, for example, of ITO, indium zinc oxide (IZO), etc. In the case of the top-emission type display panel 10, it is preferable that the passivation layer 109 be formed with a transparent material. It is preferable that the degree of transparency be 80% or greater.

The material used to form the cathode 108 may, in addition to the above materials, be for example an alkali metal or alkali earth metal, or a laminate structure having, in the following order, a layer that includes a halide of an alkali metal or alkali earth metal and a layer that includes silver. The layer that includes silver may be formed with silver alone, or with a silver alloy. Also, in order to increase light takeoff efficiency, a highly transparent refraction index adjustment layer may be provided above the layer that includes silver.

i) Passivation Layer 109

The passivation layer 109 has the function of controlling the organic light-emitting layer 106 or other layers from being exposed to water or air and is formed, for example, with silicon nitride (SiN), silicon oxynitride (SiON) etc. In the case of the top-emission type display panel 10, it is preferable that the passivation layer 109 be formed with a transparent material.

3. Structure of Anode 105

Figure 3:
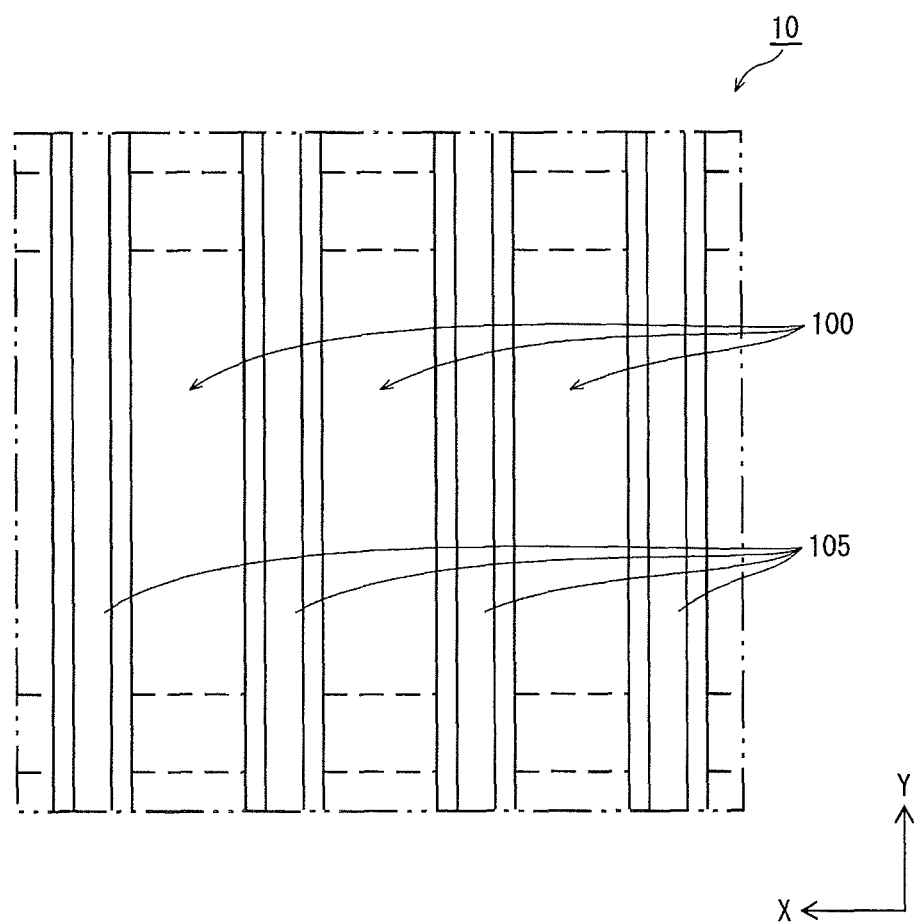
FIG. 3 is a schematic plan view showing a bank 105 in the display panel 10.

As shown in FIG. 3, the banks 105 arranged in a line are adopted as one example in the display panel 10 according to the present Embodiment. Specifically, the banks 105 each extend along the Y axis to provide partitions between adjacent sub-pixels in each pixel along the X axis. The banks 105 also serve as partitions between pixels and non-light-emitting cells (the non-light-emitting cells not shown in FIG. 3). The sub-pixels 100 in each pixel are formed so that adjacent regions partitioned by banks 105 have different luminescent colors. For example, three sub-pixels having three different luminescent colors of red (R), green (G), and blue (B) form one pixel.

4. Structure of Display Panel 10 in One Region

Figure 4:
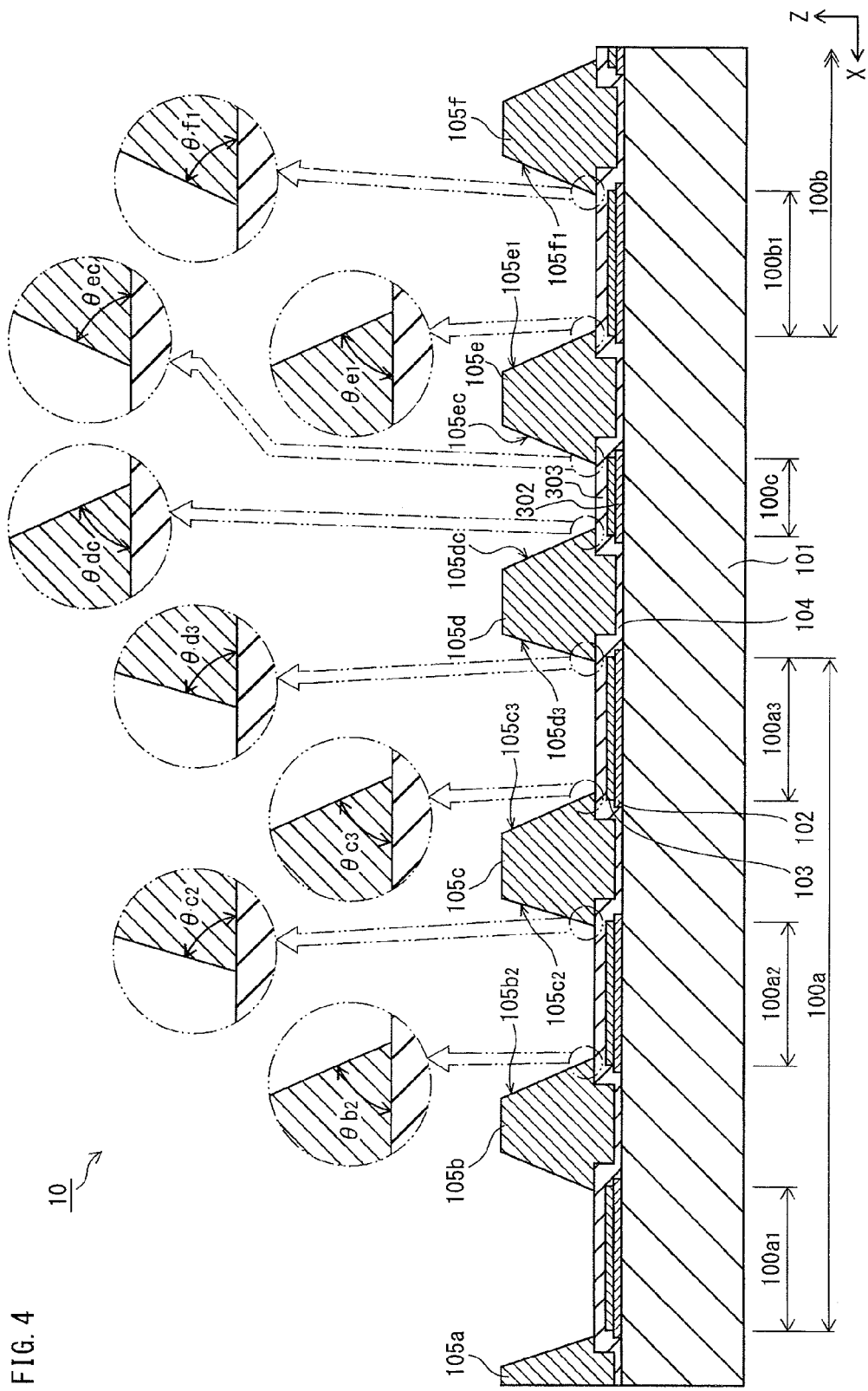
FIG. 4 is a schematic cross-section diagram showing the structure of sub-pixels 100a1-100a3 and 100b1 in pixels 100a and 100b in the display panel 10, the structure of a non-light-emitting cell 100c, and the structure of banks 105a-105f.

The structure of the display panel 10 in a region is described with reference to FIG. 4. Note that FIG. 4 is a partial schematic cross-section diagram of a cross-section A-A' of the display panel 10 in FIG. 1.

As shown in FIG. 14, the display panel 10 includes the TFT substrate (hereinafter simply referred to as the "substrate") as a base, on which a pixel 100a and a pixel 100b are arranged with a non-light-emitting cell 100c therebetween. In the pixels 100a and 100b, the anode 102 is formed for each of the sub-pixels 100a1, 100a2, 100a3, 100b1, . . . , and the electrode coating layer 103 and hole injection transporting layer 104 are layered on the anode 102 in this order.

On the hole injection transporting layer 104, banks 105a-105f formed from insulating material are established to define each sub-pixel 100a1, 100a2, 100a3, 100b1, . . . . The organic light-emitting layer is formed in the region in each sub-pixel 100a1, 100a2, 100a3, 100b1, . . . partitioned by the banks 105a-105f, and the electron injection layer, the cathode, and the passivation layer are layered on the organic light-emitting layer in this order (these layers not shown in FIG. 4).

In the display panel 10 according to the present Embodiment, the pixel 100a is composed of three sub-pixels 100a1-100a3, and the pixel 100b is composed of the sub-pixels 100b1, . . . (three sub-pixels as in the pixel 100a). As mentioned above, the non-light-emitting cell 100c is provided between the pixel 100a and the pixel 100b. The bank 105d forms a partition between the sub-pixel 100a3 of the pixel 100a and the non-light-emitting cell 100c, and bank 105e forms a partition between the pixel 100b and the non-light-emitting cell 100c.

As shown in FIG. 4, in the non-light-emitting cell 100c, provided is an electrode (busbar) 302 which is formed of the same material as the anode 102 and isolated from the anode 102, and the electrode coating layer 303 is provided on the busbar 302. On the electrode coating layer 303, the hole injection transporting layer 104 is extendedly provided. Although not shown, the cathode is formed above the hole injection transporting layer 104, and the busbar 302 is electrically connected to the cathode 108.

Note that the organic light-emitting layer is not formed in the non-light-emitting cell 100c. The above structures help reduce electrical resistance in the cathode 108 (FIG. 2) formed of ITO or the like, thus preventing a voltage drop.

As shown in FIG. 4, in the display panel 10 according to the present Embodiment, walls 105b2, 105c2, 105c3, 105d3, 105dc, 105ec, 105e1, and 105f1 of the banks 105b-105f respectively form angles θb2, θc2, θc3, θd3, θdc, θec, θe1, and θf1 with a surface of the underlayer, i.e. the hole injection transporting layer 104.

In the present Embodiment, the angles θb2, θc2, θc3, θd3, θdc, θec, θe1, and θf1 satisfy the relationships in the following expressions.

$$\theta d3 > \theta c3 \quad \text{[Expression 1]}$$

$$\theta e1 = \theta f1 \quad \text{[Expression 2]}$$

$$\theta d3 > \theta dc \quad \text{[Expression 3]}$$

$$\theta ec = \theta e1 \quad \text{[Expression 4]}$$

$$\theta c2 > \theta b2 \quad \text{[Expression 5]}$$

$$\theta dc = \theta ec \quad \text{[Expression 6]}$$

Note that in the present Embodiment, the angles θb2, θc2, θc3, θd3, θdc, θec, θe1, and θf1 are within the following ranges for an example.

$$25° < \theta b2 = \theta c3 = \theta dc = \theta ec = \theta e1 = \theta f1 < 35° \quad \text{[Expression 7]}$$

$$35° < \theta d3 < 45° \quad \text{[Expression 8]}$$

$$35° < \theta c2 < 45° \quad \text{[Expression 9]}$$

The inclination angles θb2, θc2, θc3, θd3, θdc, θec, θe1, and θf1 of the walls 105b2, 105c2, 105c3, 105d3, 105dc, 105ec, 105e1, and 105f1 are set to satisfy the above Expressions 1 to 9 because of the non-light-emitting cell 100c provided between the pixel 100a and the pixel 100b which are adjacent to each other and the spray conditions of ink 1060a1-1060a3, 1060b1, . . . which are described later.

5. Relationship Between Inclination Angle θ of Side Wall of Banks 105 and Film Thickness of Organic Light-Emitting Layer 106

The relationship between the inclination angle θ of the wall of the banks 105 and the film thickness of the organic light-emitting layer 106 is described with reference to FIGS. 5 and 6. Note that FIG. 5 is a schematic rendering of the structure of a sub-pixel.

Figure 5A:
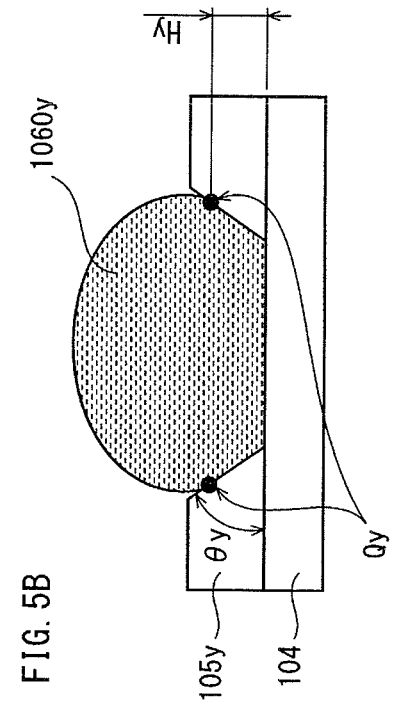
FIG. 5A is a schematic cross-section diagram showing pinning locations when the taper angle of the bank side wall is small.
Figure 5B:
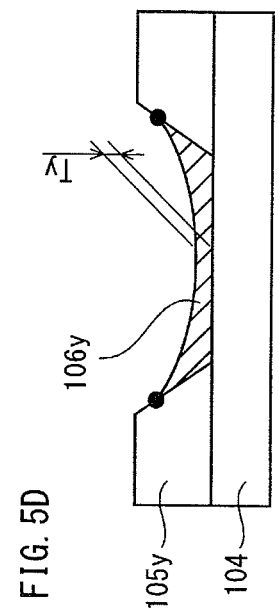
FIG. 5B is a schematic cross-section diagram showing pinning locations when the taper angle of the bank side wall is large.

As shown in FIG. 5A, the inclination angle of the wall of bank 105x (the angle between the wall of the bank 105x and the surface of the hole injection transporting layer 104) is θx, and as shown in FIG. 5B, the inclination angle of the wall of bank 105y (the angle between the wall of the bank 105y and the surface of the hole injection transporting layer 104) is θy. θx and θy satisfy the following relationship.

$$\theta y > \theta x \quad \text{[Expression 10]}$$

When ink 1060x and ink 1060y, both of which includes organic light-emitting material, is dripped into the opening partitioned by the banks 105x and 105y, the pinning locations Px and Py respectively have heights Hx and Hy that satisfy the following relationship.

$$Hy > Hx \quad \text{[Expression 11]}$$

Figure 5C:
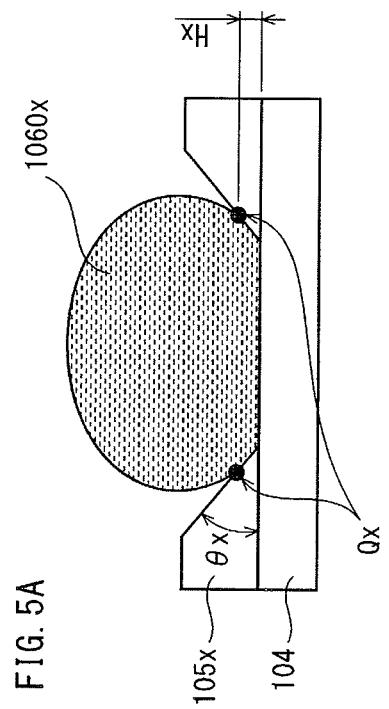
FIG. 5C is a schematic cross-section diagram showing the condition of the organic light-emitting layer after drying when the taper angle of the bank side wall is small.

As shown in FIG. 5C, after drying the ink 1060x, the height Hx of the pinning location Px is relatively low, which causes the organic light-emitting layer 106x to swell at the central portion of the sub-pixel to a film thickness of Tx.

Figure 5D:
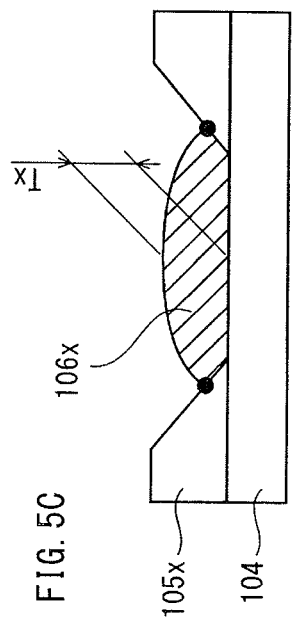
FIG. 5D is a schematic cross-section diagram showing the condition of the organic light-emitting layer after drying when the taper angle of the bank side wall is large.

On the other hand, as shown in FIG. 5D, after drying the ink 1060y, the height Hy of the pinning location Py is relatively high, which causes the organic light-emitting layer 106y to sag at the central portion of the sub-pixel to a film thickness of Ty.

The thicknesses Tx and Ty satisfy the following relationship.

$$Tx > Ty \quad \text{[Expression 12]}$$

FIG. 6 summarizes the above relationships. As shown in FIG. 6, as the inclination angle (taper angle) θ of the bank 105 grows smaller, the pinning height H lowers, and as a result, the film thickness T of the organic light-emitting layer 106 becomes thicker. Conversely, as the inclination angle (taper angle) θ of the bank 105 grows larger, the pinning height H becomes higher, and as a result, the film thickness T of the organic light-emitting layer 106 becomes thinner.

Figure 7:
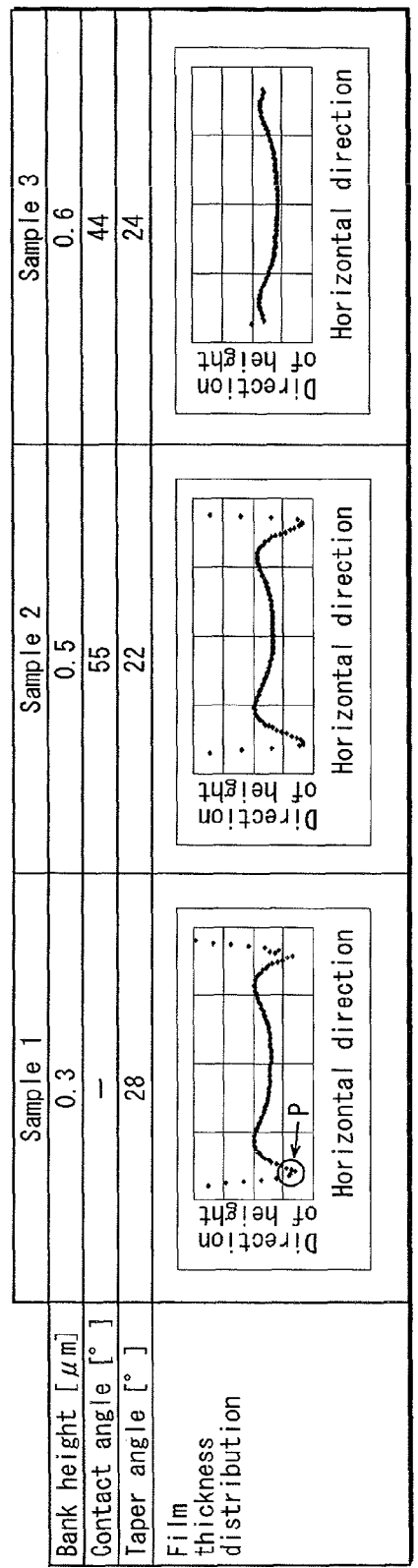
FIG. 7 shows a distribution of film thickness of the organic light-emitting layer in samples 1-3.
Figure 8:
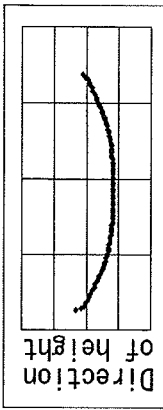
FIG. 8 shows a distribution of film thickness of the organic light-emitting layer in samples 4 and 5.
Figure 8:
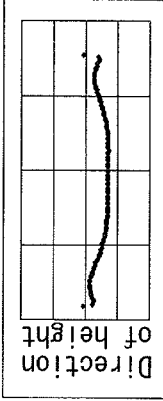

Based on the above factors, five samples were created and evaluated. FIGS. 7 and 8 show the results.

As shown in FIGS. 7 and 8, as compared to the distribution of film thickness of sample 2, the pinning location is higher in samples 3 and 4, which have a larger taper angle. Note that in FIGS. 7 and 8, the horizontal axis represents the horizontal direction, and the vertical axis represents the direction of height.

In sample 5, however, in which the bank has a taper angle (inclination angle) of 50°, the film thickness is less uniform than in sample 2.

6. Manufacturing Method of Display Panel 10

The following describes the characteristic steps of the manufacturing method of the display panel 10 according to the present Embodiment with reference to FIGS. 9, 10, and 11. Note that with regard to the manufacturing processes that are omitted in the following description, any of the variety of processes suggested by conventional technology may be used.

Figure 9A:
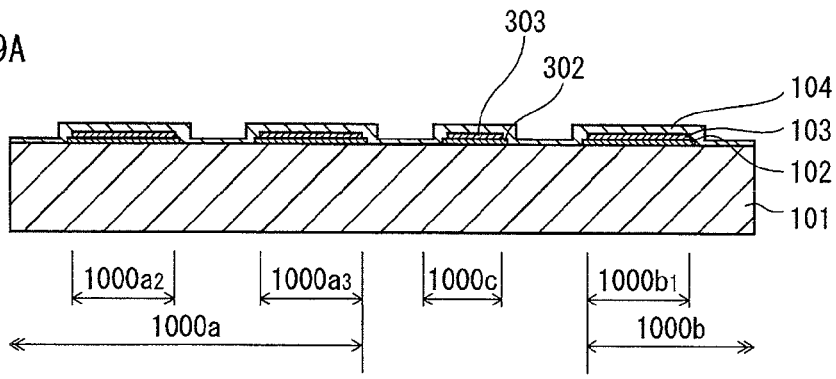
FIGS. 9A, 9B, and 9C are schematic cross-section diagrams showing, in order, the main processes in a manufacturing method of the display panel 10.

First, as shown in FIG. 9A, on the substrate 101 in the direction of the Z axis, anodes 102 and electrode coating layers 103 are layered in this order in regions 1000a1-1000a3, 1000b1, . . . in which sub-pixels are to be formed in regions 1000a and 1000b in which pixels are to be formed. Furthermore, a busbar 302 and an electrode coating layer 303 are layered in this order in the region 1000c in which a non-light-emitting cell is to be formed. A hole injection transporting layer 104 is then layered on top of the electrode coating layers 103 and 303 so as to cover the entire surface. The anodes 102 and the busbar 302 are formed, for example, by first forming a thin film made of Al or Al alloy or a thin Ag film via the sputtering method or vacuum deposition method and then patterning the thin Ag film via photolithography.

The electrode coating layers 103 and 303 are formed, for example, by forming a thin ITO film on the surfaces of the anodes 102 and the busbar 302 using a method such as the sputtering method and then patterning the thin ITO film via a method such as photolithography. To form the hole injection transporting layer 104, first a metal film is formed on the surface of the substrate 101, including the surface of the electrode coating layers 103 and 303, via a method such as the sputtering method. Subsequently, the metal film becomes oxidized, forming the hole injection transporting layer 104.

Figure 9B:
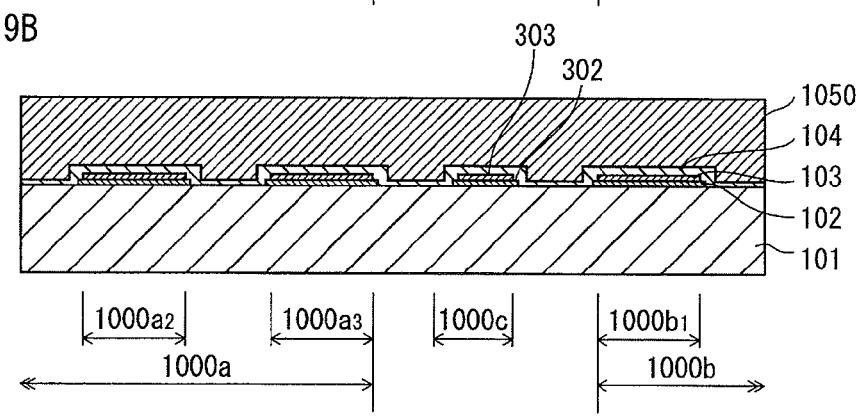

Next, as shown in FIG. 9B, the spin coat method, for example, is used to form a bank material layer 1050 so as to cover the top of the hole injection transporting layer 104. Photoresist material is used to form the bank material layer 1050. Specifically, as described above, an organic material having insulating properties such as acrylic resin, polyimide resin, novolac-type phenolic resin, etc. can be used.

Figure 9C:
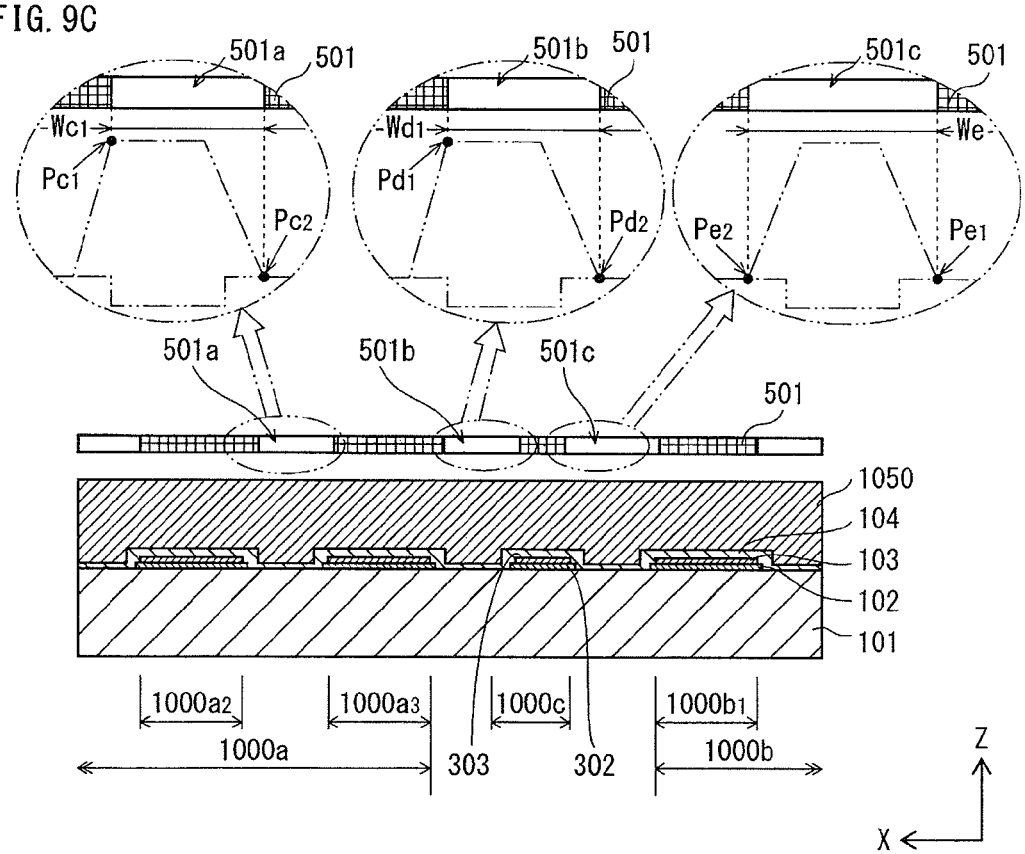

Next, as shown in FIG. 9C, a mask 501 is placed above the bank material layer 1050, the mask 501 having openings 501a, 501b, and 501c at the locations for forming the banks. Light is exposed through the openings 501a, 501ab, and 501c in the mask 501.

Note that, as shown in FIG. 9C, a width We of the opening 501c in the mask 501 is defined by points Pe1 and Pe2 at the bottom edges of walls 105e2 and 105e1 of the bank 105e (see FIG. 4) that is being formed.

On the other hand, a width Wc1 of the opening 501a in the mask 501 located between the region 1000a2 in which a sub-pixel is to be formed and the region 1000a3 in which a sub-pixel is to be formed is defined by points Pc1 and Pc2, the point Pc1 being at the upper edge of the wall 105c2 and the point Pc2 at the foot of the wall 105c3 of the bank 105c that is being formed (see FIG. 4). Also, a width Wd1 of the opening 501b in the mask 501 located between the region 1000a3 in which a sub-pixel is to be formed and the region 1000c in which the non-light-emitting cell is to be formed is defined by points Pd1 and Pd2, the point Pd1 being at the upper edge of the wall 105d3 and the point Pd2 being at the foot of a wall 105dc facing the non-light-emitting cell region 1000c of the bank 105d that is being formed (see FIG. 4).

Figure 10A:
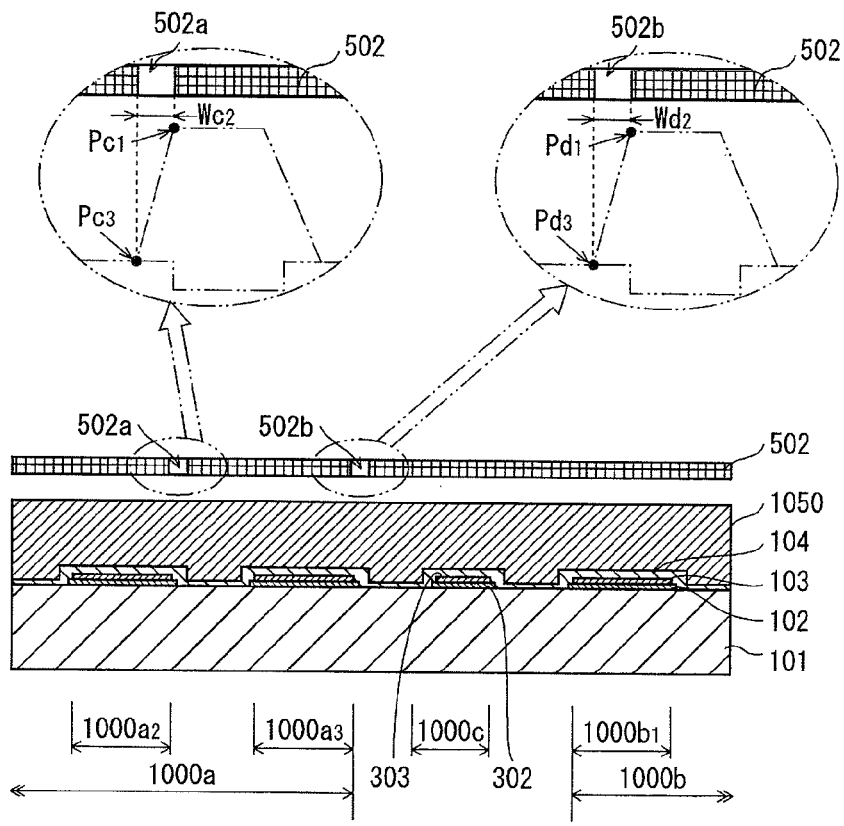
FIGS. 10A and 10B are schematic cross-section diagrams showing, in order, the main processes in the manufacturing method of the display panel 10.

Next, as shown in FIG. 10A, a mask 502 is placed above the bank material layer 1050, the mask 501 having openings 502a and 502b at the locations corresponding to respective walls 105c2 and 105d3 of the banks 105c and 105d (see FIG. 4). Light is exposed for the second time through the openings 502a and 502b in the mask 502.

Note that, as shown in FIG. 10A, a width Wc2 of the opening 502a in the mask 502 is defined by a point Pc3 at the lower edge and a point Pc1 at the upper edge of the bank 105c that is being formed, and a width Wd2 of the opening 502b in the mask 502 is defined by a point Pd3 at the lower edge and a point Pd1 at the upper edge of the bank 105d that is being formed.

Figure 10B:
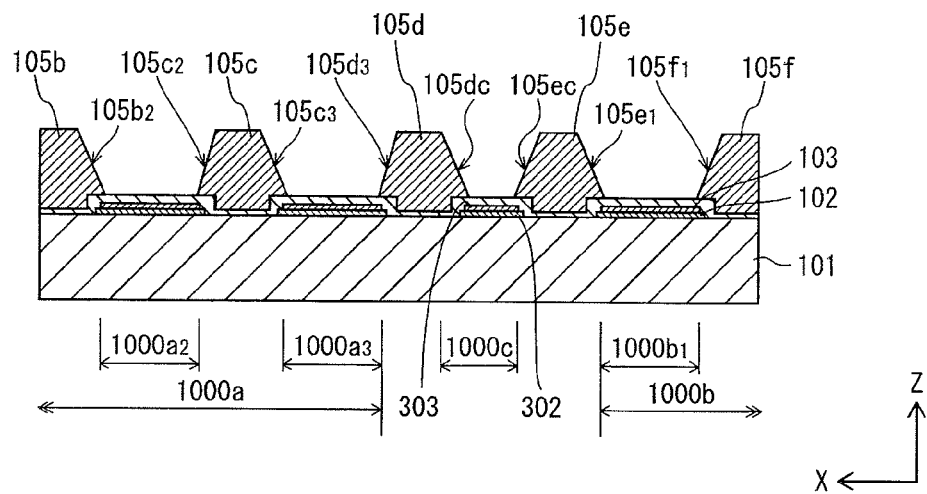

Next, as shown in FIG. 10B, the banks 105b-105f are formed by development and baking. The wall 105c2 of the bank 105c facing the region 1000a2 in which the sub-pixel is to be formed and the wall 105d3 of the bank 105d facing the region 1000a3 in which the sub-pixel is to be formed, as described above, have a larger inclination angle than the wall 105b2 of the bank 105b, the wall 105c3 of the bank 105c, the wall 105dc of the bank 105d, the walls 105ec and 105e1 of the bank 105e, and the wall 105f1 of the bank 105f.

Figure 11A:
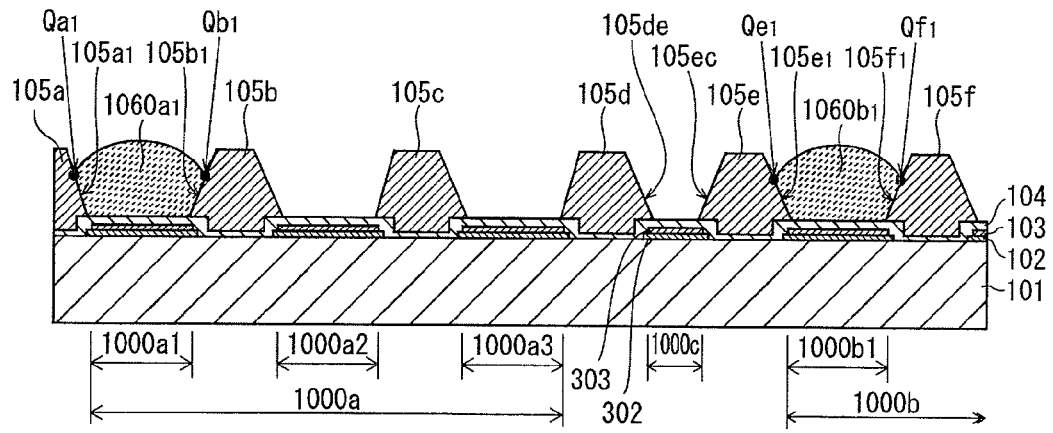
FIGS. 11A-11C are schematic cross-section diagrams showing, in order, ink application processes in the manufacturing method of the display panel 10.

Subsequently, as shown in FIG. 11A, ink 1060a1 that includes an organic light-emitting material is dripped into the opening (the region 1000a1 in which a sub-pixel is to be formed) partitioned by the banks 105a and 105b, and ink 1060b1 that includes an organic light-emitting material is dripped into the opening (the region 1000b1 in which a sub-pixel is to be formed) partitioned by the banks 105e and 105f, by the inkjet method or other method. Here, since the ink has not yet been applied to either side of each of the regions 1000a1 and 1000b1 in which the sub-pixels are to be formed, the heights of pinning locations Qa1, Qb1, Qe1, and Qf1 become equivalent to each other without varying the inclination angles of the respective walls 105a1, 105b1, 105e1, and 105f1 of the banks 105a, 105b, 105e, and 105f.

Figure 11B:
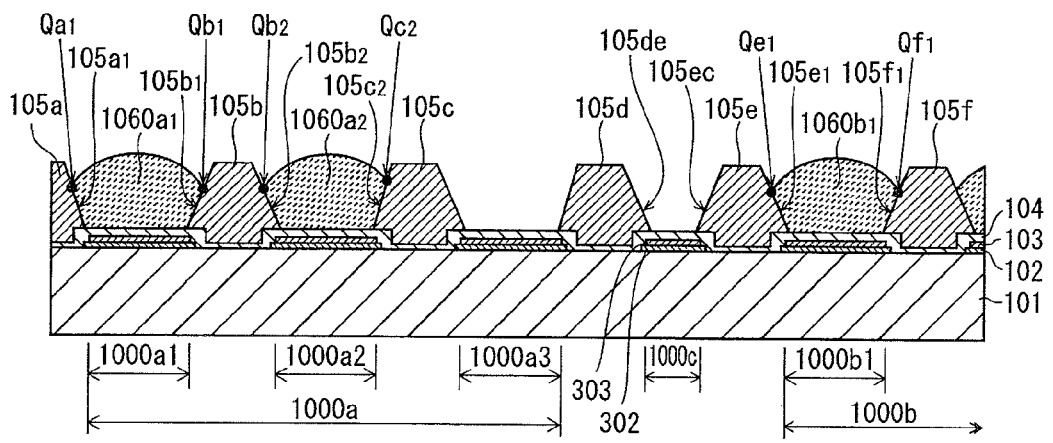

Subsequently, as shown in FIG. 11B, ink 1060a2 that includes an organic light-emitting material is dripped into the opening (the region 1000a2 in which a sub-pixel is to be formed) partitioned by the banks 105b and 105c, again, by the inkjet method or other method. Here, since the ink 1060a1 has been already applied to the region 1000a1 in which the sub-pixel is to be formed, and the ink has not yet been applied to the region 1000a3 in which the sub-pixel is to be formed, vapor concentration distribution is not uniform. Accordingly, by enlarging the inclination angle of the wall 105c2 of the bank 105c, the pinning location Qc1 of the ink 1060a2 on the wall 105c2 becomes higher than the pinning location Qb2 of the ink 1060a2 on the wall 105b2 of the bank 105b.

Regarding the region 1000b in which the pixel is to be formed, FIG. 11B does not show other regions in which sub-pixels are to be formed on the right side of the region 1000b1 in the X-axis direction. However, the ink application and the relationships of the pinning locations described with reference to the region 1000a in which the pixel is to be formed are applied to the region 1000b as well.

Figure 11C:
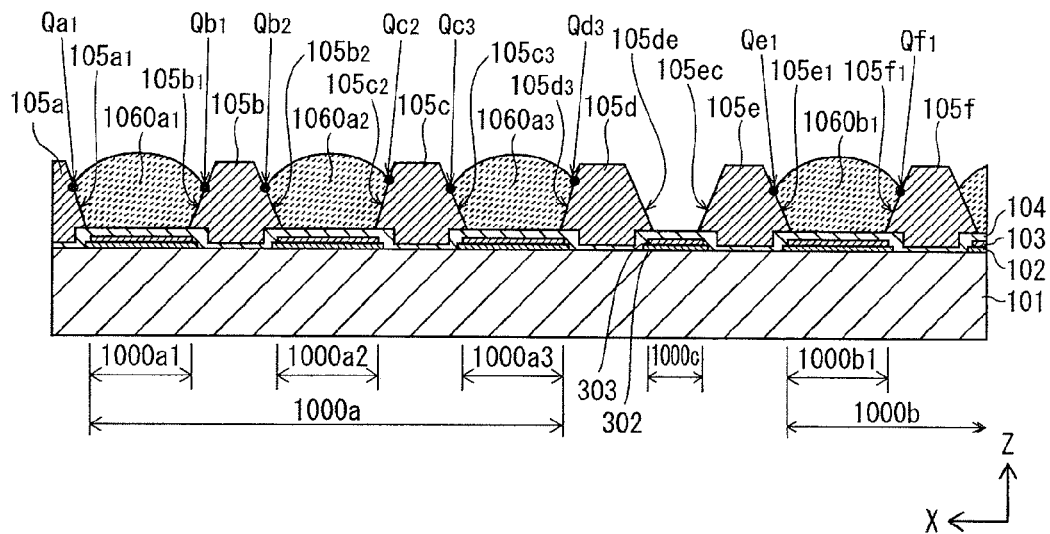

Subsequently, as shown in FIG. 11C, ink 1060a3 that includes an organic light-emitting material is dripped into the opening (the region 1000a3 in which a sub-pixel is to be formed) partitioned by the banks 105c and 105d, by the inkjet method or other method. Here, since the ink 1060a2 has been already applied to the region 1000a2 in which the sub-pixel is to be formed, and the ink is not applied to the region 1000c in which the non-light-emitting cell is to be formed, vapor concentration distribution is not uniform. Accordingly, by enlarging the inclination angle of the wall 105d3 of the bank 105d, the pinning location Qd3 of the ink 1060a3 on the wall 105d3 becomes higher than the pinning location Qc3 of the ink 1060a3 on the wall 105c3 of the bank 105c.

Regarding the region 1000b in which the pixel is to be formed, FIG. 11C does not show other regions in which sub-pixels are to be formed on the right side of the region 1000b1 in the X-axis direction. However, the ink application and the relationships of the pinning locations described with reference to the region 1000a in which the pixel is to be formed are applied to the region 1000b as well.

The heights of the pinning locations Qc2 and Qd3 are thus higher than other pinning locations Qa1, Q12, Qb2, Qc3, Qe1, and Qf1. Consequently, the uneven film thickness in the organic light-emitting layer 106 is prevented. More particularly, when the ink 1060a1, 1060a2, and 1060a3 is respectively dripped to the regions 1000a1, 1000a2, and 1000a3, in this order, at the time of application of the ink 1060a2, the ink has been already applied to the left side of the region 1000a2 beyond the bank 105b. Similarly, at the time of application of the ink 1060a3, the ink has been already applied to the left side of the region 1000a3 beyond the bank 105c. Consequently, at the time of application of the ink 1060a2 and 1060a3 to the sub-pixels 1000a2 and 1000a3, the vapor concentration distribution is not uniform. Accordingly, by enlarging the inclination angles θc2 and θd3 of the walls 105c2 and 105d3 of the banks 105c and 105d compared to other walls, the uneven film thickness in the organic light-emitting layer 106 is prevented.

The same is true for the region 1000b in which the pixel is to be formed. Note that, although omitted from the drawings, the display panel 10 is formed by drying the ink, and subsequently layering, in order, the electron injection layer 107, the cathode 108, the passivation layer 109, etc.

7. Application Process and Drying Process of Ink

A description is given of a relationship between an ink application process and an ink drying process with reference to FIG. 12.

Figure 12A:
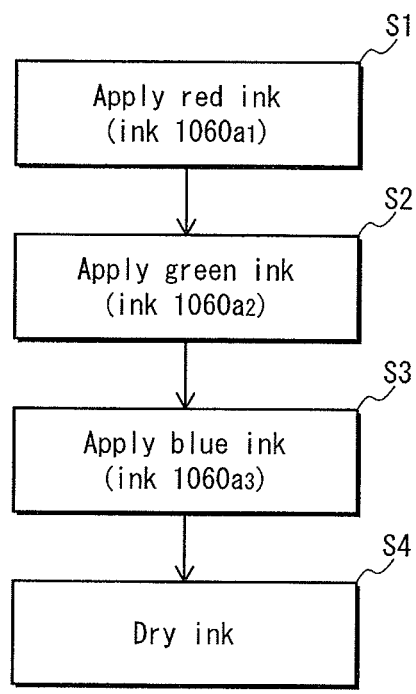
FIG. 12A is a schematic flowchart showing a sequence of the application and drying processes of ink 1060a1-1060a3.

As shown in FIG. 12A, in the Embodiment, red ink (ink 1060a1) is applied (step S1), and subsequently green ink (ink 1060a2) is applied (step S2), and then blue ink (ink 1060a3) is applied (step S3). After that, the drying process is performed simultaneously for all the ink (step S4).

Figure 12B:
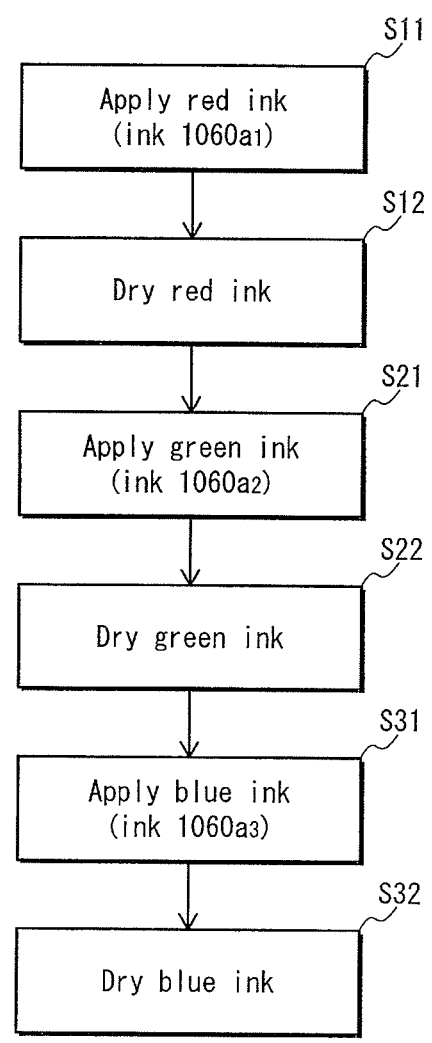
FIG. 12B is a flowchart showing another sequence of the application and drying processes of the ink 1060a1-1060a3.

Alternatively, as shown in FIG. 12B, the red ink (ink 1060a1) may be applied (step S11) and dried (step S12) first, and subsequently the green ink (ink 1060a2) may be applied (step S21) and dried (step S22), and then the blue ink (ink 1060a3) may be applied (step S31) and dried (step S32) step by step. In this case also, the inclination angles of the walls 105$b$2, 105$c$2, 105$c$3, 105$d$3, 105$dc$, 105$ec$, 105$e$1, and 105$f$1 of the banks 105$a$, 105$b$, 105$c$, 105$d$, 105$e$, and 105$f$ satisfy the above-mentioned relationships. Accordingly, the uneven film thickness in the organic light-emitting layer is again prevented.

8. Advantageous Effects

As shown in FIG. 4, in the display panel 10 of the display device 1 according to the present Embodiment, the inclination angle $\theta c2$ of the wall 105$c$2 of the bank 105$c$ facing the sub-pixel 100$a$2 and the inclination angle $\theta d3$ of the wall 105$d$3 of the bank 105$d$ facing the sub-pixel 100$a$3 are set larger than the inclination angles $\theta b2$, $\theta c3$, $\theta dc$, $\theta ec$, $\theta e1$, and $\theta f1$ of other walls 105$b$2, 105$c$3, 105$dc$, 105$ec$, 105$e$1, and 105$f$1. As a result, as sequentially shown in FIGS. 11A to 11C, the pinning locations Q$c$2 and Q$d$3 are higher than other pinning locations Q$a$1, Q$b$1, Q$b$2, Q$c$3, Q$e$1, and Q$f$1 when the ink 1060$a$1, 1060$a$2, 1060$a$3, 1060$b$1, . . . is dripping.

Furthermore, the respective inclination angles $\theta b2$, $\theta c3$, $\theta dc$, $\theta ec$, $\theta e1$, $\theta f1$, . . . of the walls 105$a$1, 105$b$1, 105$b$2, 105$c$3, 105$de$, 105$ec$, 105$e$1, and 105$f$1 (note that the reference numeral for the inclination angle of the wall 105$a$1 is omitted in FIG. 4) are equivalent to each other.

Accordingly, in the display panel 10, the film thickness of the organic light-emitting layer 106 after drying is uniform between all sub-pixels including the sub-pixels 100$a$1, 100$a$2, 100$a$3, and 100$b$1, which has the advantageous effect of substantially even luminance.

Note that the manufacturing method of the display device 1 according to the present Embodiment as described with reference to FIGS. 9, 10, and 11 can be used to manufacture a display device 1 having these advantageous effects.

Note that the term "equivalent" above does not mean exact mathematical equivalence, but rather takes factors such as tolerance when manufacturing the display device 1 into account. Specifically, the term "equivalent" refers to making the inclination angles equivalent within practical tolerance for luminous efficiency (uneven luminance) between the sub-pixels 100$a$1, 100$a$2, 100$a$3, 100$b$1, defined between the banks of the display panel 10.

Furthermore, in the banks 105$d$ and 105$e$, the inclination angle $\theta dc$ and $\theta ec$ of the walls 105$dc$ and 105$ec$ facing the non-light-emitting cell 100$c$ is relatively smaller than the inclination angle $\theta c2$ of the wall 105$c$2 of the bank 105$c$ and the inclination angle $\theta d3$ of the wall 105$d$3 of the bank 105$d$. This prevents the problems of disconnection in the cathode 108 and the production of leak current, which is formed over the banks 105$d$ and 105$e$, thereby assuring the electrical connection between the cathode 10 and the busbar 302.

[Modification 1]

Figure 13:
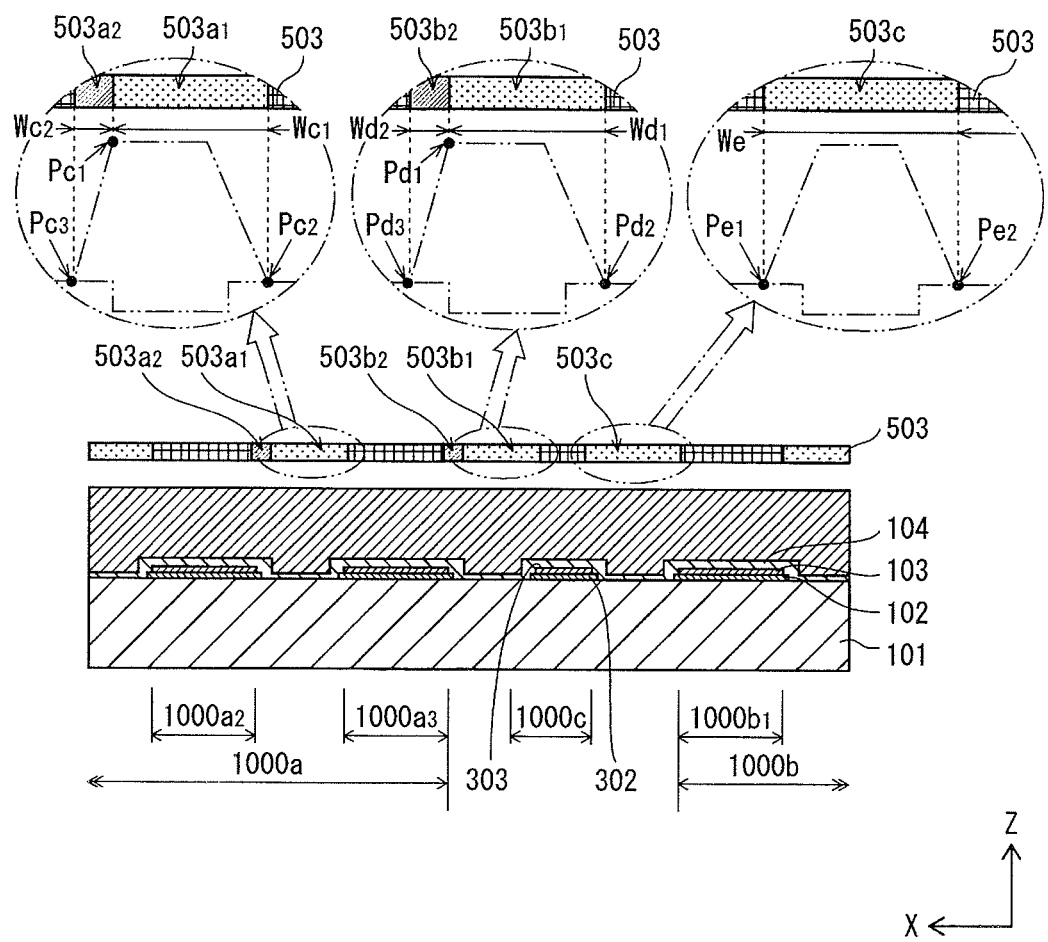
FIG. 13 is a schematic cross-section diagram showing, in order, the main processes in the manufacturing method of Modification 1.

Next, with reference to FIG. 13, Modification 1 of the manufacturing method of the display device 1 is described. FIG. 13 shows processes corresponding to the processes shown from FIGS. 9C-10A.

As shown in FIG. 13, after layering the bank material layer 1050 on top of the hole injection transporting layer 104, a mask 503 is placed above the bank material layer 1050. The mask 503 has optical transmission sections 503$a$1, 503$a$2, 503$b$1, 503$b$2, and 503$c$. The optical transmission section 503$c$ is provided in correspondence to the location where the bank 105$e$ is to be formed, the optical transmission sections 503$a$1 and 503$a$2 are provided in correspondence to the location where the bank 105$c$ is to be formed, and the optical transmission sections 503$b$1 and 503$b$2 are provided in correspondence to the location where the bank 105$d$ is to be formed.

In the manufacturing method of the display device 1 according to Modification 1, the width We of the optical transmission section 503$c$, which is almost between the region 1000$c$ in which the non-light-transmitting cell is to be formed and the region 1000$b$1 in which the sub-pixel is to be formed, is defined by the points Pe1 and Pe2 at the bottom edges of the walls 105$ec$ and 105$e$1 of the bank 105$e$ (see FIG. 4) that is being formed.

On the other hand, the width Wc1 of the optical transmission section 503$a$1, which is between the region 1000$a$2 in which the sub-pixel is to be formed and the region 1000$a$3 in which the sub-pixel is to be formed, is defined by a point Pc2 at the bottom edge of the wall 105$c$3 of the bank 105$c$ that is being formed and a point Pc1 at the upper edge of the wall 105$c$2 of the bank 105$c$ that is being formed (see FIG. 4), and the width Wd1 of the optical transmission section 503$b$1, which is between the region 1000$a$3 in which the sub-pixel is to be formed and the region 1000$c$ in which the non-light-emitting cell is to be formed, is defined by a point Pd2 at the bottom edge of the wall 105$dc$ of the bank 105$d$ that is being formed and a point Pd1 at the upper edge of the wall 105$d$3 of the bank 105$d$ that is being formed (see FIG. 4). The width Wc2 of the optical transmission section 503$a$2 is also defined by the point Pc1 at the upper edge of the wall 105$c$2 and a point Pc3 at the bottom edge of the wall 105$c$2 of the bank 105$c$ (see FIG. 4), and the width Wd2 of the optical transmission section 503$b$2 is defined by the point Pd1 at the upper edge of the wall 105$d$3 and a point Pd3 at the bottom edge of the wall 105$d$3 of the bank 105$d$ (see FIG. 4).

The mask 503 is formed using a half-tone or other mask, and the degree of transparency of the optical transmission sections 503$a$1, 503$b$1, and 503$c$ differs from that of the optical transmission sections 503$a$2 and 503$b$2. Specifically, the degree of transparency of the optical transmission sections 503$a$2 and 503$b$2 is larger than the degree of transparency of the optical transmission sections 503$a$1, 503$b$1, and 503$c$.

The mask 503 with the above-described structure is put in place, and after exposure and development, the banks 105$b$-105$f$ are formed as shown in FIG. 10B by baking. In other words, at the locations exposed to light via the optical transmission sections 503$a$2 and 503$b$2, which have a larger degree of transparency, the side walls have a larger inclination angle than at the locations exposed to light via the optical transmission sections 503$a$1, 503$b$1, and 503$c$, as in the relationships indicated in Expressions 1-4.

Note that subsequent processes are the same as the above Embodiment.

The display device 1 can be manufactured with this type of manufacturing method.

[Modification 2]

Figure 14A:
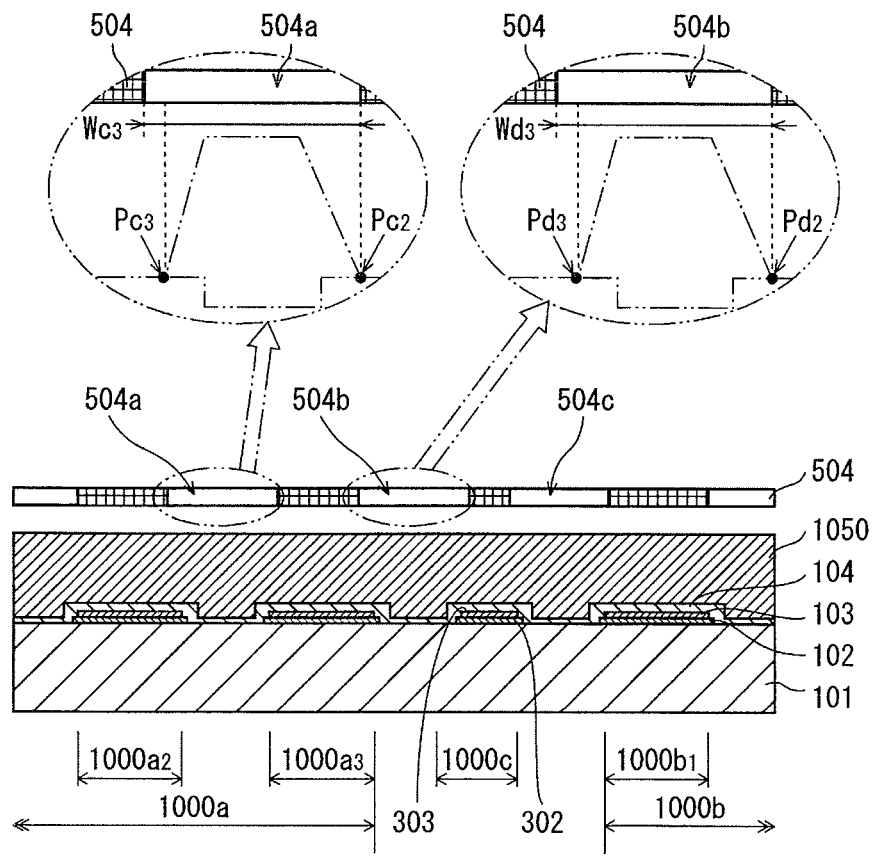
FIGS. 14A and 14B are schematic cross-section diagrams showing, in order, the main processes in the manufacturing method of Modification 2.
Figure 14B:
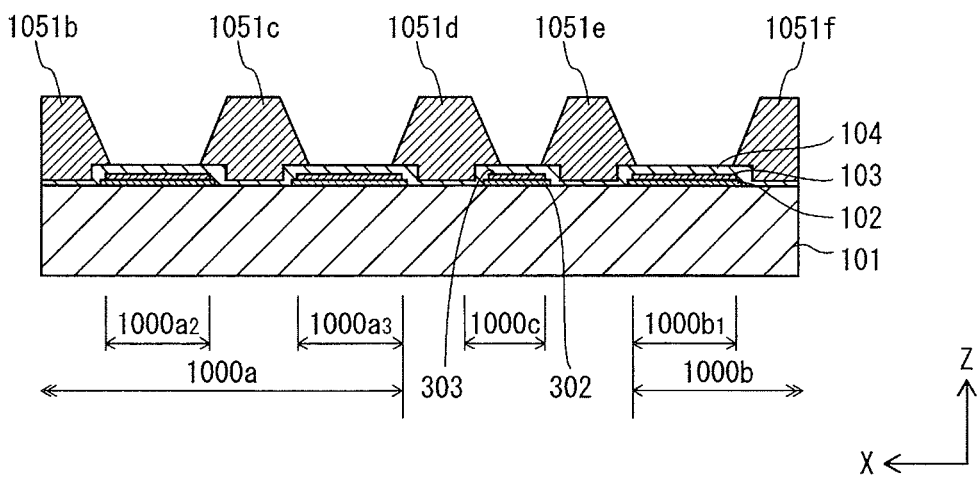
Figure 15A:
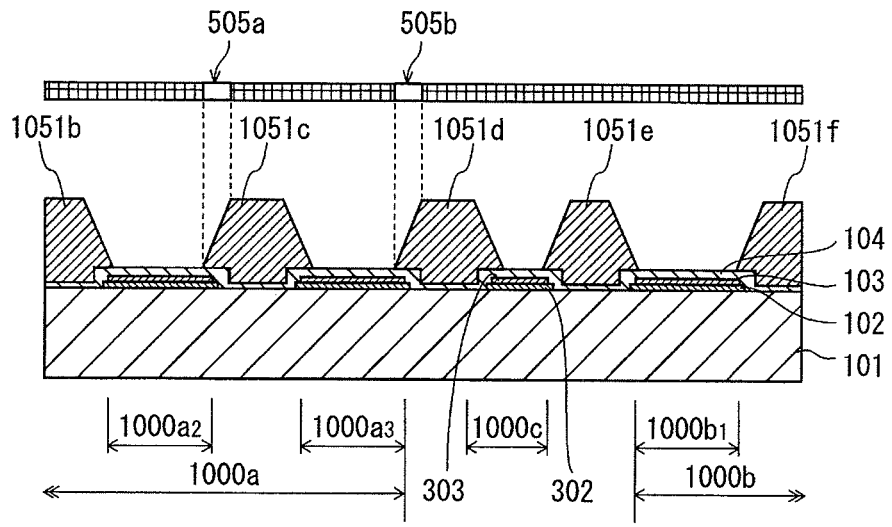
FIGS. 15A and 15B are schematic cross-section diagrams showing, in order, the main processes in the manufacturing method of Modification 2.
Figure 15B:
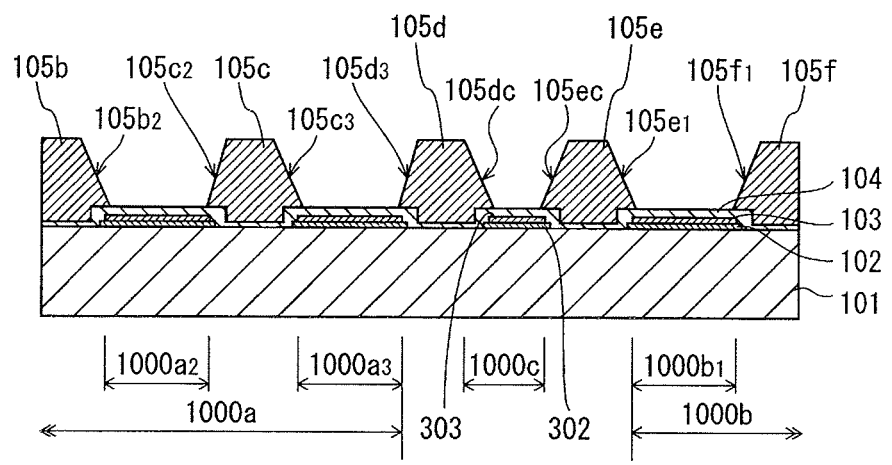
Figure 15B:
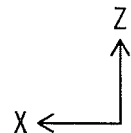

Next, with reference to FIGS. 14 and 15, Modification 2 of the manufacturing method of the display device 1 is described. FIGS. 14 and 15 show processes corresponding to the processes shown from FIGS. 9C-10B.

As shown in FIG. 14A, after layering the bank material layer 1050 on top of the hole injection transporting layer 104, a mask 504 is placed above the bank material layer 1050. The mask 504 has openings 504$a$, 504$b$, and 504$c$ which are provided in correspondence to the locations where the banks 105 are to be formed.

The opening 504$c$ is formed to have the same width as the opening 501$c$ in the mask 501 used in the manufacturing method of the above Embodiment.

On the other hand, the width Wc3 (Wd3) of the opening 504$a$ (504$b$) provided in the location between the region 1000$a$2 in which the sub-pixel is to be formed and the region 1000a3 in which the sub-pixel is to be formed (between the region 1000a3 in which the sub-pixel is to be formed and the region 1000c in which the non-light-emitting cell is to be formed) where the bank 105c (105d) is to be formed (see FIG. 4) is set to be larger than the width defined by the points Pc2 and Pc3 (Pd2 and Pd3) at the lower edges of the walls 105c2 and 105c3 (105d3 and 105dc) of the bank 105c (105d) (see FIG. 4), as shown by the section surrounded by lines with alternate long and two short dashes in FIG. 14A. Specifically, the width is made larger at the sections where the inclination angle is to be greater.

The mask 504 shown in FIG. 14A is put in place, and exposure and development take place for the first time. As shown in FIG. 14B, bank material layers 1051b-1051f remain in the locations corresponding to the openings 504a-504c, . . . .

Note that, as shown in FIG. 14B, the inclination angles of walls in the bank material layers 1051b-1051f are uniform after the first exposure and development. Note that, however, the widths of the bank material layers 1051c and 1051d are greater than those of the bank material layers 1051b, 1051e, and 1051f in the X-axis direction.

In Modification 2, baking does not take place at this point.

As shown in FIG. 15A, a mask 505 is placed above the bank material layers 1051b-1051f that have been formed. Among the locations in the mask 505 corresponding to the walls of the banks 105b-105f, . . . that are being formed, openings 505a and 505b are provided only at the locations (the wall 105c2 of the bank 105c and the wall 105d3 of the bank 105d) where the inclination angles are to be made larger.

With the mask 505 set in place, exposure and development takes place for the second time, and the banks 105b-105f shown in FIG. 15B are formed by baking. Thus, the inclination angle of the wall 105c2 of the bank 105c and the inclination angle of the wall 105d3 of the bank 105d are larger than those of other walls 105b2, 105c3, 105dc, 105ec, 105e1, and 105f1.

Subsequently, the display device 1 can be manufactured by performing the same processes as in the above Embodiment and Modification.

[Verification of Manufacturing Method]

Using a concrete example, the shape of the banks after formation was verified for the manufacturing method according to the above Embodiment and Modifications 1 and 2. The results are described with reference to FIG. 16.

Figure 16A:
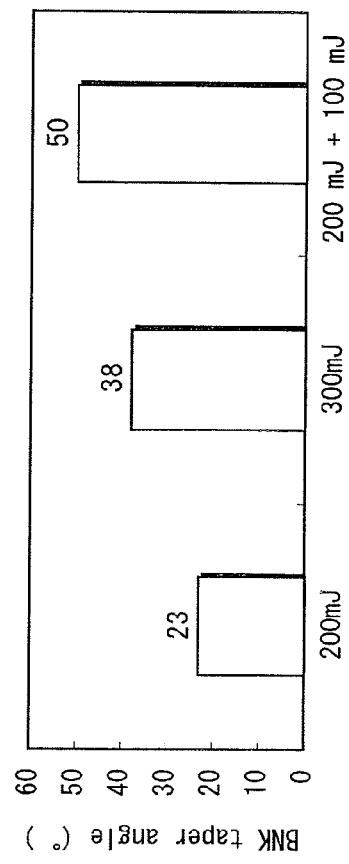
FIG. 16A shows the relationship between the taper angle of a bank and exposure/developing.

As shown in FIG. 16A, as the exposure amount increases, the inclination angle of the side wall of the bank that is formed becomes larger. Specifically, when exposure and development take place with an exposure amount of 200 mJ, the inclination angle of the side wall of the bank that is formed is 23°, whereas when exposure and development take place with an exposure amount of 300 mJ, the inclination angle of the side wall of the bank that is formed is 38°. This result was also shown by the Atomic Force Microscope (AFM) shown in FIG. 16B.

Figure 16B:
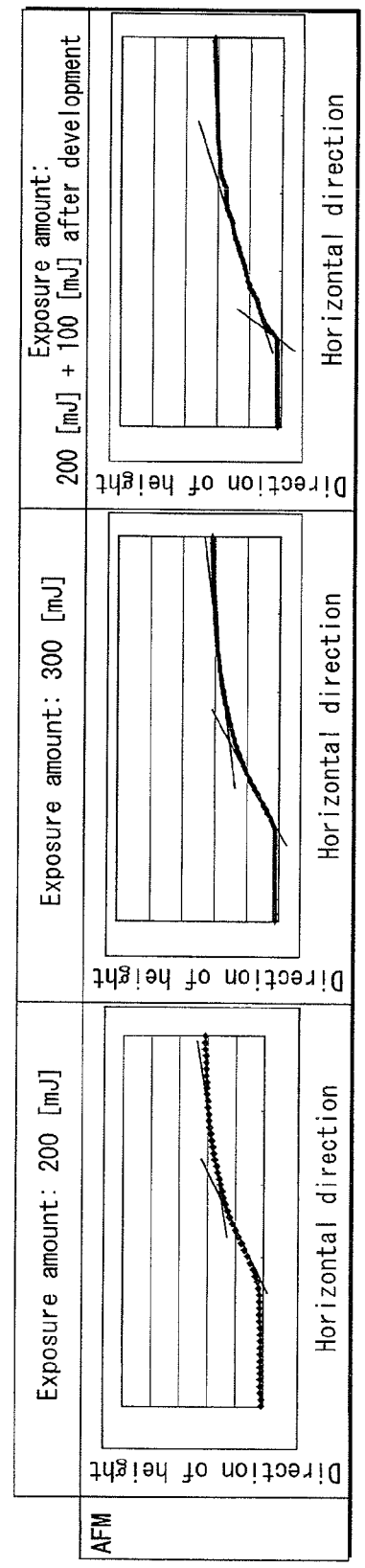
FIG. 16B shows AFM graphs that indicate the shapes of banks.

Furthermore, as shown in FIGS. 16A and 16B, after light exposure and development take place for the first time with an exposure amount of 200 mJ and subsequently for the second time with an exposure amount of 100 mJ, the inclination angle of the side wall of the bank that is formed is 50°. This corresponds to the manufacturing method according to Modification 2 and is considered to be effective for creating a large inclination angle of the bank side wall.

Note that in FIG. 16B, the horizontal axis represents the horizontal direction, and the vertical axis represents the direction of height.

[Other Considerations]

Figure 17A:
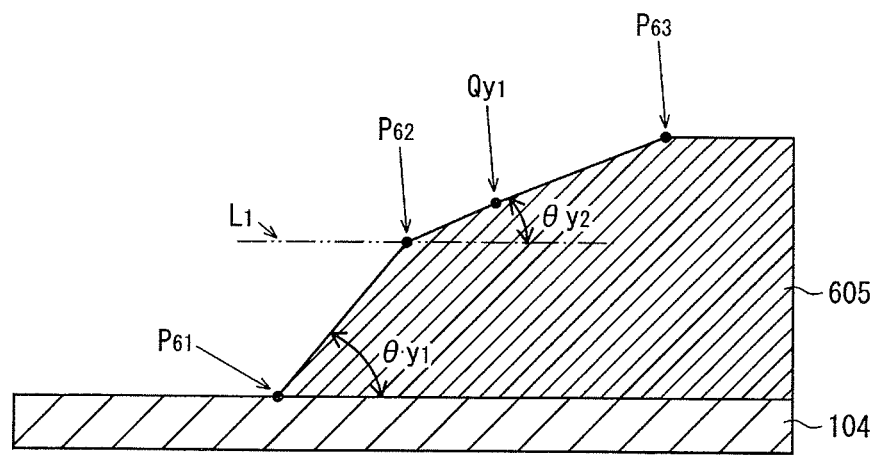
FIGS. 17A and 17B are schematic cross-section diagrams for illustrating the definition of the taper angle.

Firstly, although in the above Embodiment and Modifications 1 and 2 the banks 105, 105a-105f, 105x, and 105y each having planar walls are schematically shown, it is not always necessary to make the bank walls planar. For example, as shown in FIG. 17A, in a case of the bank 605, a wall extending from a point $P_{61}$ to a point $P_{62}$ intersects with a wall extending from a point $P_{62}$ to a point $P_{63}$. In this case, a pinning location $Q_y1$ lies somewhere on the wall between the point $P_{62}$ and the point $P_{63}$ when ink is dripping. What is important with respect to a relationship with the pinning location is an inclination angle $\theta_y2$ formed between the wall and a virtual line $L_1$, which is drawn to pass through the point $P_{62}$.

Figure 17B:
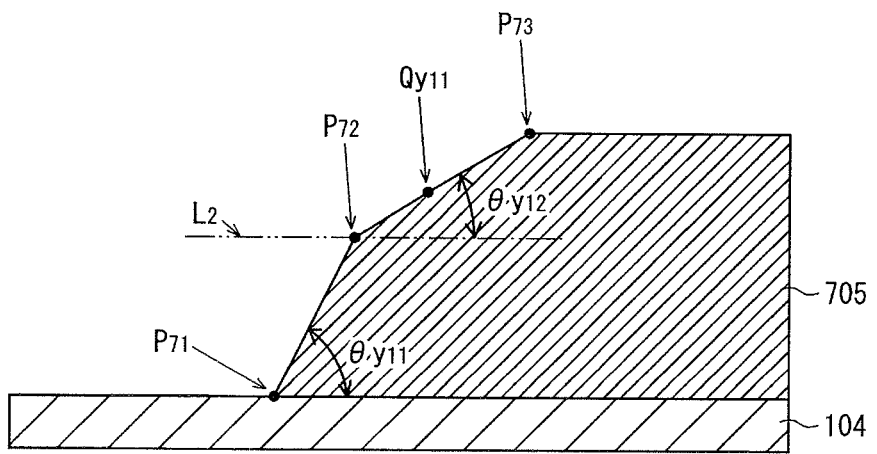

However, when forming the bank 605, the angle $\theta_y2$ can be controlled by controlling an angle $\theta_y1$ formed between the hole injection transporting layer 104, which is the base layer, and the point $P_{61}$ of the bank 605, and thus actually the above effects can be achieved by controlling the inclination angle $\theta_y1$. Specifically, imagine that a bank 705, in which an angle $\theta_y11$ formed by a wall extending from a point $P_{71}$ to a point $P_{72}$ is larger than the angle $\theta_y1$ shown in FIG. 17A, is formed (see FIG. 17B). As shown in FIG. 17B, an angle $\theta_y12$ formed between the wall extending from a point $P_{72}$ to a point $P_{73}$ and a virtual line $L_2$ is also larger than the angle $\theta_y2$ shown in FIG. 17A.

Figure 18:
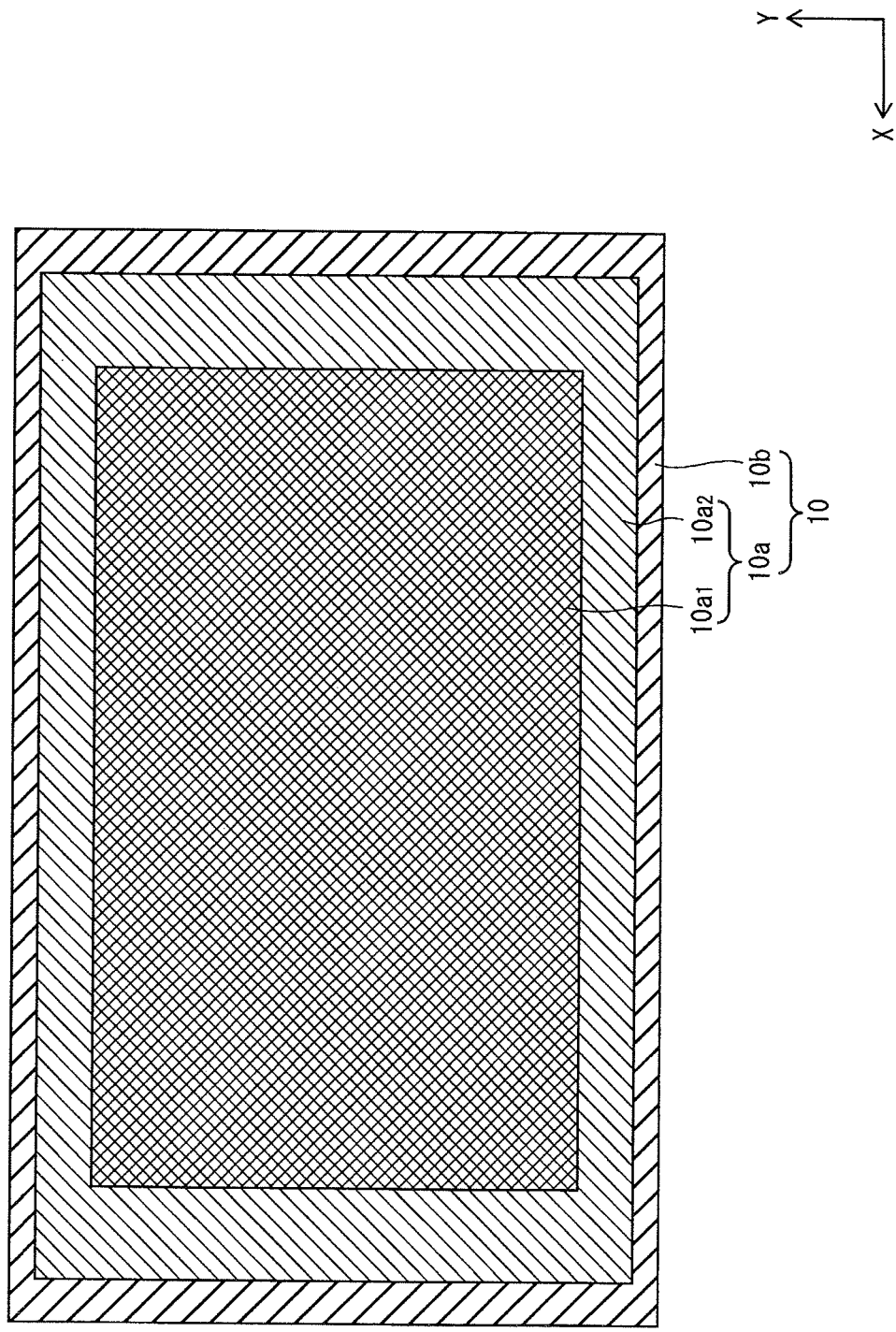
FIG. 18 is a schematic plan view for illustrating areas 10a1, 10a2, and 10b in the display panel 10.

Secondly, although in the above Embodiment and Modifications 1 and 2 the extent of regions in the display panel 10 to which the above-described structure is applicable is not specified, the above-described structure may be applied to all or only part of the regions in the display panel. As shown in FIG. 18, the display panel 10 can be theoretically divided into an area 10a in the central region and an area 10b around the central region in a direction along a main surface of the display panel 10. Note that the area 10a is connected to a source electrode or a drain electrode of the TFT layer below which the anodes are formed, and contributes to light-emitting. On the other hand, the area 10b is not connected to the source electrode nor to the drain electrode below which the anodes are formed, and does not contribute to light-emitting. Now, assume that the area 10a is further divided into a central area 10a1 and a surrounding area 10a2 in terms of a formation stage. Due to a vapor concentration distribution state when ink is dripping, the uneven film thickness in the organic light-emitting layer is expected to become more evident in sub-pixels within the surrounding area 10a2.

It is therefore considered preferable for the surrounding area 10a2 and the area 10b to encompass pixels located, for example, in a range of 0.5% to a few percentage points (e.g. 1%) of the peripheral region of the panel in total. This range is based on a consideration of variety in film thickness of the organic light-emitting layer in a case where the inclination angles of the bank walls are not adjusted.

In the above Embodiment and Modifications 1 and 2, structures were adopted by way of example in order to clearly illustrate a structure of the present invention and the effects and advantages thereof. Except for its essential elements, the present invention is not limited to the above structures. For example, in the above Embodiment, as shown in FIG. 2, a structure was adopted by way of example in which anodes 102 are located below the organic light-emitting layer 106 in the direction of the Z axis. The present invention is not limited, however, to this structure; a structure may be adopted in which cathodes 108 are located below the organic light-emitting layer 106 in the direction of the Z axis.

In the case in which cathodes 108 are located below the organic light-emitting layer 106 in the direction of the Z axis, since the panel is a top-emission structure, a structure is adopted in which the cathodes 108 are a reflecting electrode layer, above which the electrode coating layer 103 is formed.

Figure 19:
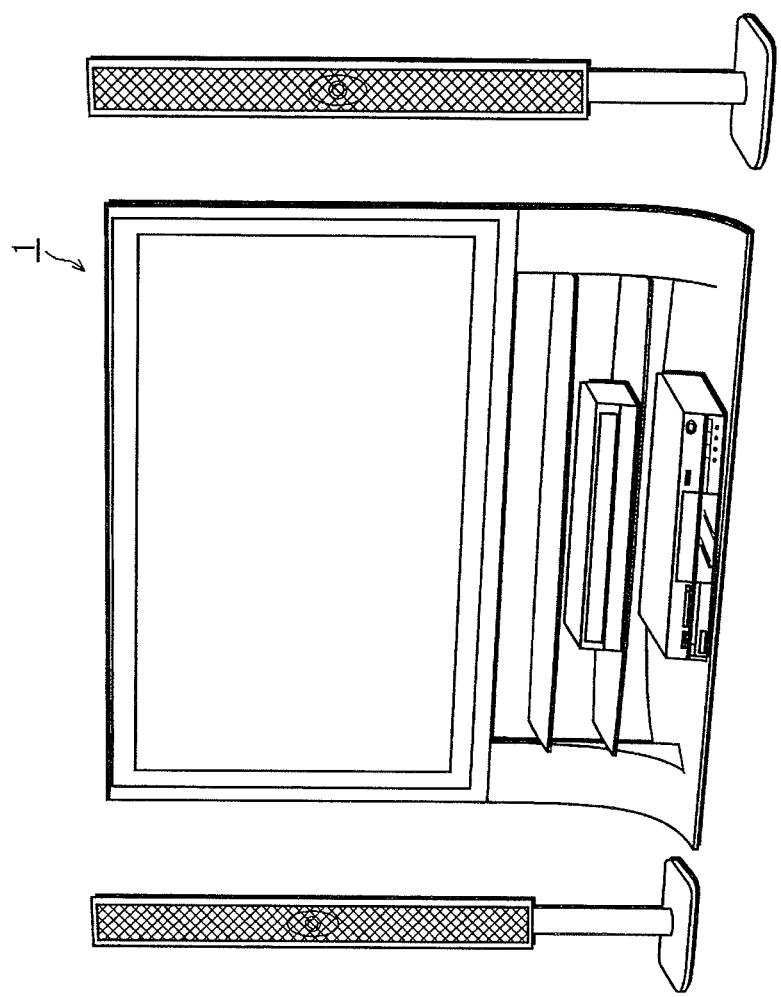
FIG. 19 is an external perspective view showing an example of the appearance of a set that includes the organic display device 1.

Furthermore, in the above Embodiment and Modifications, a specific example of the appearance of the display device 1 is not shown. The display device 1 may be part of a system as shown, for example, in FIG. 19. Note that an organic EL display device does not require a backlight, as does a liquid crystal display device, and is therefore suitable for producing a thinner display, a superior characteristic from the perspective of system design.

Also, in the above Embodiment and Modifications 1 and 2, a so-called line bank structure is adopted as the shape of the banks 105, 105a-105f, 105x, 105y, 605, and 705, as shown in FIG. 3. However, as shown in FIG. 20, a pixel bank 805 may be adopted in the structure of a display panel 80, the pixel bank 805 being formed by bank elements 805a that extend in the direction of the Y axis and bank elements 805b that extend in the direction of the X axis.

Figure 20:
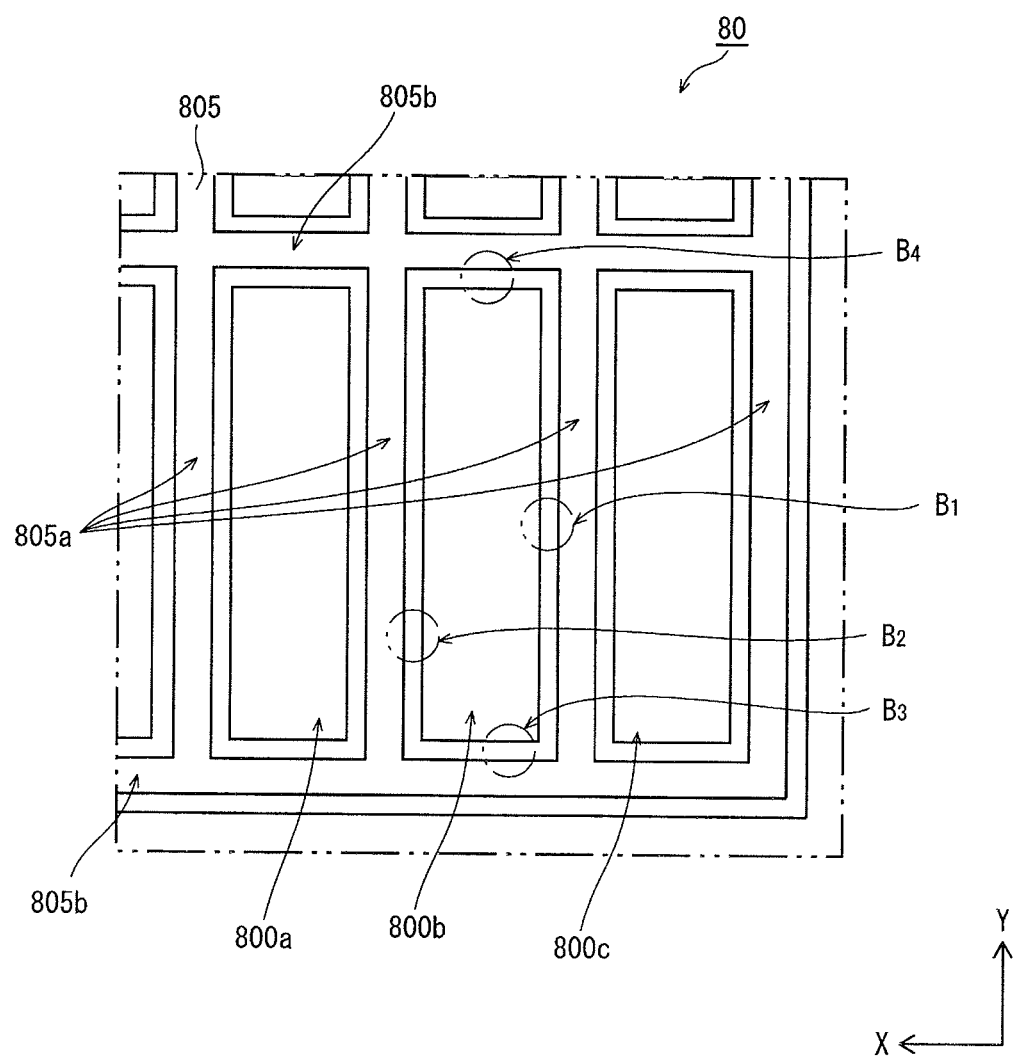
FIG. 20 is a schematic plan view showing the structure of a bank 805 provided in a display panel 80 according to Modification 3.

As shown in FIG. 20, when using the pixel bank 805, the same advantageous effects as above can be achieved by enlarging the inclination angles of the side walls on each side in the directions of the X axis and the Y axis of the bank 805 defining the sub-pixels 800a, 800b, and 800c. Specifically, the same advantageous effects as above can be achieved by appropriately adjusting the inclination angles of the side walls indicated by the arrows $B_1$, $B_2$, $B_3$, and $B_4$.

In the above Embodiment and Modifications 1 and 2, the inclination angles of the side walls of the banks are individually adjusted depending on the vapor concentration distribution observed in the ink application process and drying process in formation of an organic light-emitting layer in manufacturing. For example, if the flow of vapor during drying of the ink is from the outer periphery of the panel towards the central region of the panel due to some factor such as the structure of the drying device, then the inclination angle of the bank side walls may be made larger at locations where the film thickness of the organic light-emitting layer becomes thicker. The film thickness of the organic light-emitting layer can thus be made uniform, which has the advantageous effect of making luminance more even throughout the panel.

Although in the above Embodiment and in Modifications 1 and 2 no distinction is made in inclination angle (i.e. taper angle) of each bank wall between the luminescent colors (red, green, blue), the characteristics of the ink including the organic light-emitting material can change according to luminescent color. The inclination angle of the corresponding bank wall can be specified in accordance with the ink characteristics of each luminescent color.

Furthermore, although in the above Embodiment and in Modifications 1 and 2 the busbar 302 and the anode 102 are formed of the same material, it is not always necessary to use the same material. Note that, however, when the busbar 302 and the anode 102 are formed of the same material, these members are formed in the identical process, thus reducing manufacturing cost.

Furthermore, although in the present application document the term "on", such as in phrases "layered on" and "formed on", is used for illustrative purposes, "on" does not denote that elements etc. must be in a direct contact with each other, and includes the meanings of "above" and "over". The term "above" includes the meanings of "on" and "over" as well.

INDUSTRIAL APPLICABILITY

The present invention is useful for achieving an organic light-emitting panel and an organic display device that exhibit substantially even luminance and are capable of high image quality.

REFERENCE SIGNS LIST 1 display device
10, 80 display panel
10a1 light-emitting central area
10a2 light-emitting surrounding area
10b dummy area
20 drive control unit
21-24 drive circuit
25 control circuit
100a, 100b pixel
100a1-100a3, 100b1 sub-pixel
100a, 100b non-light-emitting cell
101 substrate
102 anode
103, 303 electrode coating layer
104 hole-injection layer
105, 105a-105f, 105x, 105y, 605, 705, 805 bank
106, 106x, 106y organic light-emitting layer
107 electron injection layer
108 cathode
109 passivation layer
302 bulbar
501-505 mask
1000a, 1000b region in which pixel is to be formed
1000a1-1000a2, 1000b1 region in which sub-pixel is to be formed
1000c region in which non-light-emitting cell is to be formed
1050, 1051b, 1051c, 1051d, 1051e, 1051f bank material layer
1060a1-1060a3, 1060b1, 1060x, 1060y ink

The invention claimed is:

1. An organic light-emitting panel, comprising:
a first pixel comprising a first, a second, and a third light-emitting cell consecutively arranged for light emission in colors different from each other and applied with ink corresponding to a first, a second, and a third luminescent color, the second light-emitting cell arranged between the first and the third light-emitting cell, each of the first, the second, and the third light-emitting cell comprising: a base layer including a first electrode; an organic light-emitting layer layered above the base layer and applied with ink including organic light-emitting material of the corresponding luminescent color; a second electrode disposed opposite the base layer with the organic light-emitting layer in between; and a plurality of banks formed above the base layer as partitions between adjacent light-emitting cells;
a second pixel different from the first pixel, the second pixel comprising a first, a second, and a third light-emitting cell consecutively arranged for light emission in colors different from each other and applied with ink corresponding to a first, a second, and a third luminescent color, the second light-emitting cell arranged between the first and the third light-emitting cell, each of the first, the second, and the third light-emitting cell comprising: the base layer including a first electrode; an organic light-emitting layer layered above the base layer and applied with ink including organic light-emitting material of the corresponding luminescent color; the second electrode disposed opposite the base layer with the organic light-emitting layer in between; and a plurality of banks formed above the base layer as partitions between adjacent light-emitting cells;

a non-light-emitting cell between the third light-emitting cell of the first pixel and the first light-emitting cell of the second pixel, the non-light-emitting cell not including the organic light-emitting layer and including the second electrode and a third electrode, the third electrode isolated from the first electrode and electrically connected to the second electrode;

a first bank different from the plurality of banks, the first bank formed between the first pixel and the non-light-emitting cell as a partition between the third light-emitting cell of the first pixel and the non-light-emitting cell; and a second bank different from the first bank and from the plurality of banks, the second bank formed between the second pixel and the non-light-emitting cell as a partition between the first light-emitting cell of the second pixel and the non-light-emitting cell, wherein with respect to two opposing banks defining the third light-emitting cell of the first pixel, an inclination angle of a first wall facing the third light-emitting cell of the first pixel in the first bank located closer to the non-light-emitting cell is larger than an inclination angle of a second wall facing the third light-emitting cell of the first pixel in a third bank located closer to the second light-emitting cell, with respect to two opposing banks defining the first light-emitting cell of the second pixel, an inclination angle of a third wall facing the first light-emitting cell of the second pixel in the second bank located closer to the non-light-emitting cell is equivalent to an inclination angle of a fourth wall facing the first light-emitting cell of the second pixel in a fourth bank located closer to the second light-emitting cell, the organic light-emitting layer of the third light-emitting cell of the first pixel extends along the first wall of the first bank and along the second wall of the third bank, and the organic light-emitting layer of the first light-emitting cell of the second pixel extends along the third wall of the second bank and along the fourth wall of the fourth bank, and the inclination angle of each of the first wall of the first bank, the second wall of the third bank, the third wall of the second bank, and the fourth wall of the fourth bank is an angle formed by a corresponding one of the first wall, the second wall, the third wall, and the fourth wall and an underlayer from which each of the first wall, the second wall, the third wall, and the fourth wall inclines.

2. The organic light-emitting panel of claim 1, wherein
the inclination angle of the first wall facing the third light-emitting cell of the first pixel in the first bank is larger than an inclination angle of a fifth wall facing the non-light-emitting cell in the first bank, and
the inclination angle of the third wall facing the first light-emitting cell of the second pixel in the second bank is equivalent to an inclination angle of a sixth wall facing the non-light-emitting cell in the second bank.

3. The organic light-emitting panel of claim 1, wherein
in each of the first and the second pixel,
inclination angles of opposing walls in two opposing banks defining the second light-emitting cell are different from each other, and an inclination angle of a fifth wall facing the second light-emitting cell and located closer to the third light-emitting cell is larger than an inclination angle of a sixth wall facing the second light-emitting cell and located closer to the first light-emitting cell.

4. The organic light-emitting panel of claim 1, wherein
an inclination angle of a fifth wall facing the non-light-emitting cell in the first bank is equivalent to an inclination angle of a sixth wall facing the non-light-emitting cell in the second bank.

5. The organic light-emitting panel of claim 1, wherein
in each of the first and the second pixel,
the organic light-emitting layer is formed by dripping the ink corresponding to the first, the second, and the third luminescent color to the first, the second, and the third light-emitting cell, respectively, in the stated order.

6. An organic display device including the organic light-emitting panel of claim 1.

7. A manufacturing method of an organic light-emitting panel including a first and a second pixel and a non-light-emitting cell between the first and the second pixel, the first and the second pixel each comprising a first, a second, and a third light-emitting cell, the second light-emitting cell arranged between the first and the third light-emitting cell, the manufacturing method comprising:

forming a base layer over a substrate, the base layer including first electrodes;

layering photoresist material above the base layer;

forming, via mask exposure and patterning of the photoresist material layered above the base layer, a first, a second, and a third opening respectively corresponding to the first, the second, and the third light-emitting cell as the first pixel and a plurality of banks as partitions between adjacent light-emitting cells, a first, a second, and a third opening respectively corresponding to the first, the second, and the third light-emitting cell as the second pixel and a plurality of banks as partitions between adjacent light-emitting cells, an opening corresponding to the non-light-emitting cell between the third light-emitting cell of the first pixel and the first light-emitting cell of the second pixel, and a first and a second bank, the first bank formed as a partition between the first pixel and the non-light-emitting cell, the second bank formed as a partition between the second pixel and the non-light-emitting cell;

forming an organic light-emitting layer by dripping ink that includes organic light-emitting material to each of the first, the second, and the third opening in the first and the second pixel and drying the ink; and forming a second electrode above the organic light-emitting layer, wherein with respect to two opposing banks defining the third light-emitting cell of the first pixel, an inclination angle of a first wall facing the third light-emitting cell of the first pixel in the first bank located closer to the non-light-emitting cell is formed to be larger than an inclination angle of a second wall facing the third light-emitting cell of the first pixel in a third bank located closer to the second light-emitting cell, and with respect to two opposing banks defining the first light-emitting cell of the second pixel, an inclination angle of a third wall facing the first light-emitting cell of the second pixel in the second bank located closer to the non-light-emitting cell is formed to be equivalent to an inclination angle of a fourth wall facing the first light-emitting cell of the second pixel in a fourth bank located closer to the second light-emitting cell, in each of the first and the second pixel, the organic light-emitting layer is formed by applying ink corresponding to a first, a second, and a third luminescent color to the first, the second, and the third light-emitting cell, respectively, in the stated order, the organic light-emitting layer of the third light-emitting cell of the first pixel extends along the first wall of the first bank and along the second wall of the third bank, and the organic light-emitting layer of the first light-emitting cell of the second pixel extends along the third wall of the second bank and along the fourth wall of the fourth bank, and the inclination angle of each of the first wall of the first bank, the second wall of the third bank, the third wall of the second bank, and the fourth wall of the fourth bank is an angle formed by a corresponding one of the first wall, the second wall, the third wall, and the fourth wall and an underlayer from which each of the first wall, the second wall, the third wall, and the fourth wall inclines.

8. The manufacturing method of claim 7, wherein
with respect to two opposing banks defining the third light-emitting cell of the first pixel, the inclination angle of the first wall facing the third light-emitting cell of the first pixel in the first bank located closer to the non-light-emitting cell is formed to be larger than the inclination angle of the second wall facing the third light-emitting cell of the first pixel in the third bank located closer to the second light-emitting cell, by setting an exposure amount in a section corresponding to the first wall facing the third light-emitting cell of the first pixel in the first bank located closer to the non-light-emitting cell larger than an exposure amount in a section corresponding to the second wall facing the third light-emitting cell of the first pixel in the third bank located closer to the second light-emitting cell.

9. The manufacturing method of claim 7, wherein
with respect to two opposing banks defining the third light-emitting cell of the first pixel, the inclination angle of the first wall facing the third light-emitting cell of the first pixel in the first bank located closer to the non-light-emitting cell is formed to be larger than the inclination angle of the second wall facing the third light-emitting cell of the first pixel in the third bank located closer to the second light-emitting cell, by using a mask in which a degree of transparency in a section corresponding to the first wall facing the third light-emitting cell of the first pixel in the first bank located closer to the non-light-emitting cell is larger than a degree of transparency in a section corresponding to the second wall facing the third light-emitting cell of the first pixel in the third bank located closer to the second light-emitting cell.

10. The manufacturing method of claim 7, wherein
with respect to two opposing banks defining the third light-emitting cell of the first pixel, the inclination angle of the first wall facing the third light-emitting cell of the first pixel in the first bank located closer to the non-light-emitting cell is formed to be larger than the inclination angle of the second wall facing the third light-emitting cell of the first pixel in the third bank located closer to the second light-emitting cell, by exposing and developing the photoresist material to the two opposing banks defining the third light-emitting cell of the first pixel, and then additionally exposing the photoresist material in a section corresponding to the first wall facing the third light-emitting cell of the first pixel in the first bank located closer to the non-light-emitting cell.

11. An organic display device including an organic light-emitting panel obtained by the manufacturing method according to any of claim 7.

12. An organic light-emitting panel, comprising:
a first pixel comprising a first, a second, and a third light-emitting cell consecutively arranged for light emission in colors different from each other and applied with ink corresponding to a first, a second, and a third luminescent color, the second light-emitting cell arranged between the first and the third light-emitting cell, each of the first, the second, and the third light-emitting cell comprising: a base layer including a first electrode; an organic light-emitting layer layered above the base layer and applied with ink including organic light-emitting material of the corresponding luminescent color; a second electrode disposed opposite the base layer with the organic light-emitting layer in between; and a plurality of banks formed above the base layer as partitions between adjacent light-emitting cells;

a second pixel different from the first pixel, the second pixel comprising a first, a second, and a third light-emitting cell consecutively arranged for light emission in colors different from each other and applied with ink corresponding to a first, a second, and a third luminescent color, the second light-emitting cell arranged between the first and the third light-emitting cell, each of the first, the second, and the third light-emitting cell comprising: the base layer including a first electrode; an organic light-emitting layer layered above the base layer and applied with ink including organic light-emitting material of the corresponding luminescent color; the second electrode disposed opposite the base layer with the organic light-emitting layer in between; and a plurality of banks formed above the base layer as partitions between adjacent light-emitting cells;

a non-light-emitting cell between the third light-emitting cell of the first pixel and the first light-emitting cell of the second pixel, the non-light-emitting cell not including the organic light-emitting layer and including the second electrode and a third electrode, the third electrode isolated from the first electrode and electrically connected to the second electrode;

a first bank different from the plurality of banks, the first bank formed between the first pixel and the non-light-emitting cell as a partition between the third light-emitting cell of the first pixel and the non-light-emitting cell; and a second bank different from the first bank and from the plurality of banks, the second bank formed between the second pixel and the non-light-emitting cell as a partition between the first light-emitting cell of the second pixel and the non-light-emitting cell, wherein with respect to two opposing banks defining the third light-emitting cell of the first pixel, an inclination angle of a first wall facing the third light-emitting cell of the first pixel in the first bank located closer to the non-light-emitting cell is larger than an inclination angle of a second wall facing the third light-emitting cell of the first pixel in a third bank located closer to the second light-emitting cell, with respect to two opposing banks defining the first light-emitting cell of the second pixel, an inclination angle of a third wall facing the first light-emitting cell of the second pixel in the second bank located closer to the non-light-emitting cell is equivalent to an inclination angle of a fourth wall facing the first light-emitting cell of the second pixel in a fourth bank located closer to the second light-emitting cell, the inclination angle of each of the first wall, the second wall, the third wall, and the fourth wall is an angle formed by a corresponding one of the first wall, the second wall, the third wall, and the fourth wall and an underlayer on which each of the first bank, the third bank, the second bank, and the fourth bank is provided, and in a cross-section taken along a direction of arrangement of the first light-emitting cell, the second light-emitting cell, and the third light-emitting cell in the first pixel and the second pixel, the first bank is asymmetric and the second bank is symmetric.

13. The organic light-emitting panel of claim 12, wherein
the inclination angle of the first wall facing the third light-emitting cell of the first pixel in the first bank is larger than an inclination angle of a fifth wall facing the non-light-emitting cell in the first bank, and
the inclination angle of the third wall facing the first light-emitting cell of the second pixel in the second bank is equivalent to an inclination angle of a sixth wall facing the non-light-emitting cell in the second bank.

14. The organic light-emitting panel of claim 12, wherein in each of the first and the second pixel,
inclination angles of opposing walls in two opposing banks defining the second light- emitting cell are different from each other, and an inclination angle of a fifth wall facing the second light-emitting cell and located closer to the third light-emitting cell is larger than an inclination angle of a sixth wall facing the second light-emitting cell and located closer to the first light-emitting cell.

15. The organic light-emitting panel of claim 12, wherein an inclination angle of a fifth wall facing the non-light-emitting cell in the first bank is equivalent to an inclination angle of a sixth wall facing the non-light-emitting cell in the second bank.

16. The organic light-emitting panel of claim 12, wherein in each of the first and the second pixel,
the organic light-emitting layer is formed by dripping the ink corresponding to the first, the second, and the third luminescent color to the first, the second, and the third light-emitting cell, respectively, in the stated order.

17. An organic display device including the organic light-emitting panel of claim 12.

\* \* \* \* \*